United States Patent
Ota

(10) Patent No.: US 8,119,493 B2
(45) Date of Patent: Feb. 21, 2012

(54) METHOD OF FORMING A SEMICONDUCTOR DEVICE AN ALIGNMENT MARK FORMED IN A GROOVE

(75) Inventor: Yohei Ota, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/970,197

(22) Filed: Dec. 16, 2010

(65) Prior Publication Data

US 2011/0151641 A1      Jun. 23, 2011

(30) Foreign Application Priority Data

Dec. 18, 2009   (JP) .................. 2009-287802

(51) Int. Cl.
*H01L 21/76*     (2006.01)
*H01L 21/00*     (2006.01)
*H01L 23/544*    (2006.01)

(52) U.S. Cl. ........ 438/401; 438/462; 438/975; 257/797; 257/E23.179

(58) Field of Classification Search .............. 438/401, 438/462, 975; 257/797, E23.179
See application file for complete search history.

(56) References Cited

U.S. PATENT DOCUMENTS

| | | | |
|---|---|---|---|
| 6,218,262 B1 * | 4/2001 | Kuroi et al. | 438/401 |
| 2002/0005594 A1 * | 1/2002 | Iwamatsu | 257/797 |
| 2003/0216009 A1 * | 11/2003 | Matsuura et al. | 438/460 |
| 2007/0155167 A1 * | 7/2007 | Choi | 438/629 |
| 2008/0038897 A1 * | 2/2008 | Suzuki et al. | 438/401 |

FOREIGN PATENT DOCUMENTS

| | | |
|---|---|---|
| JP | 2006-339476 A | 12/2006 |
| JP | 2007-081095 A | 3/2007 |

* cited by examiner

*Primary Examiner* — Kevin Parendo
(74) *Attorney, Agent, or Firm* — Sughrue Mion, PLLC

(57) ABSTRACT

A method of forming a semiconductor device includes the following processes. A first groove is formed in a semiconductor substrate. An insulating film is formed in the first groove. An interlayer insulating film is formed over the semiconductor substrate. A removing process is performed to remove a part of the interlayer insulating film and a part of the insulating film to form an alignment mark in the first groove.

14 Claims, 31 Drawing Sheets

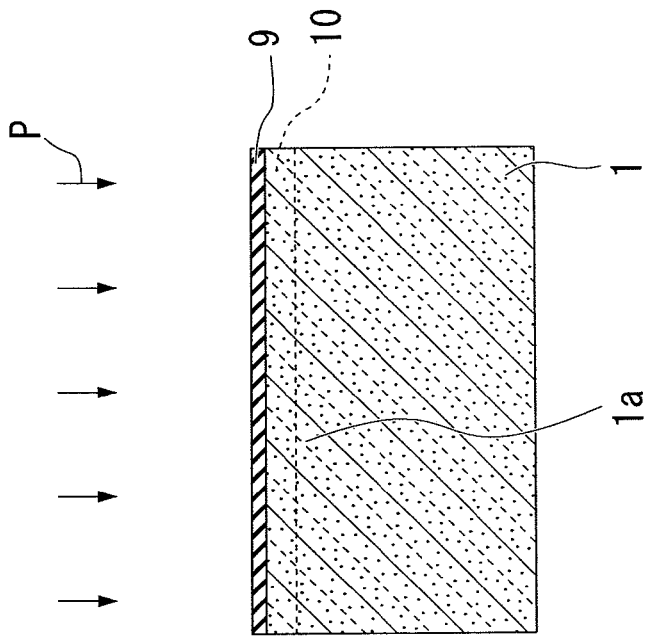
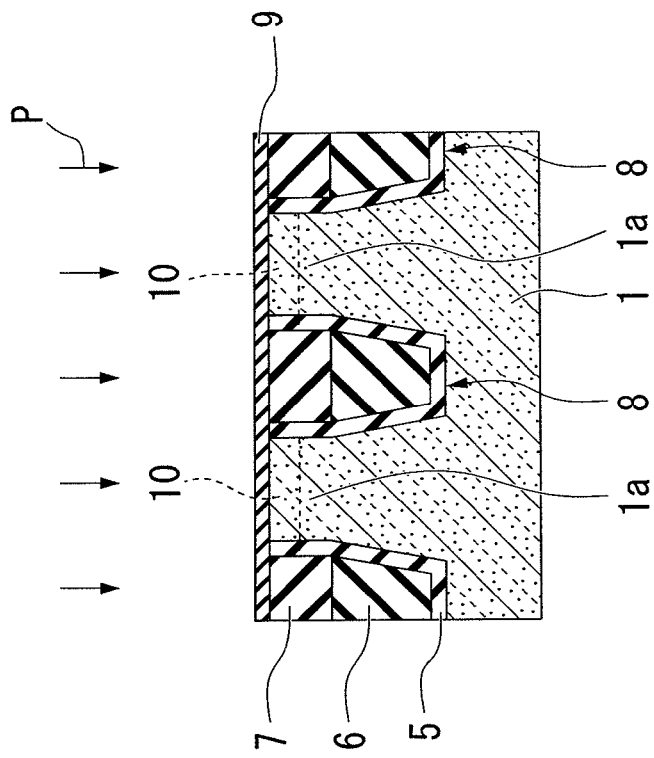

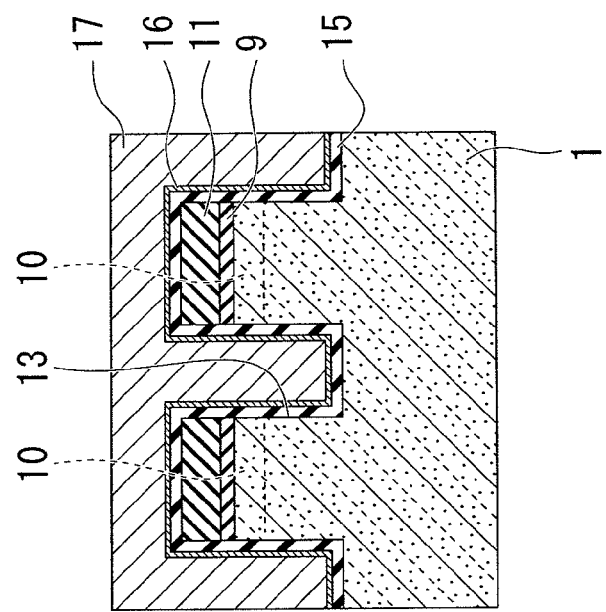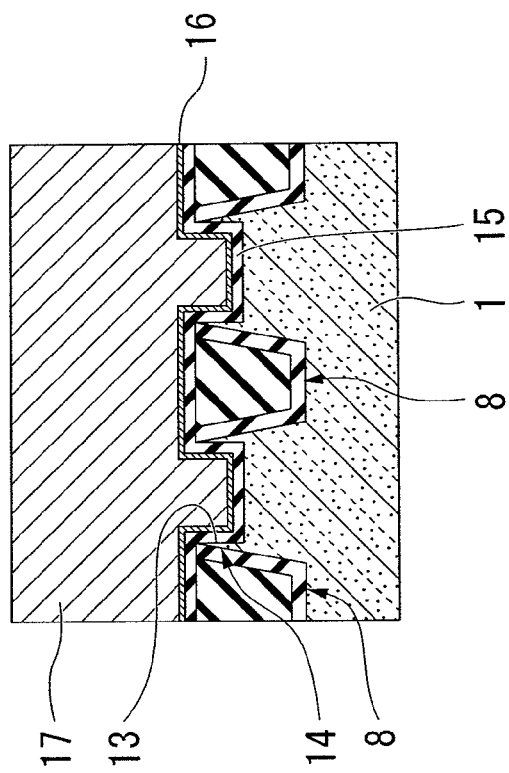

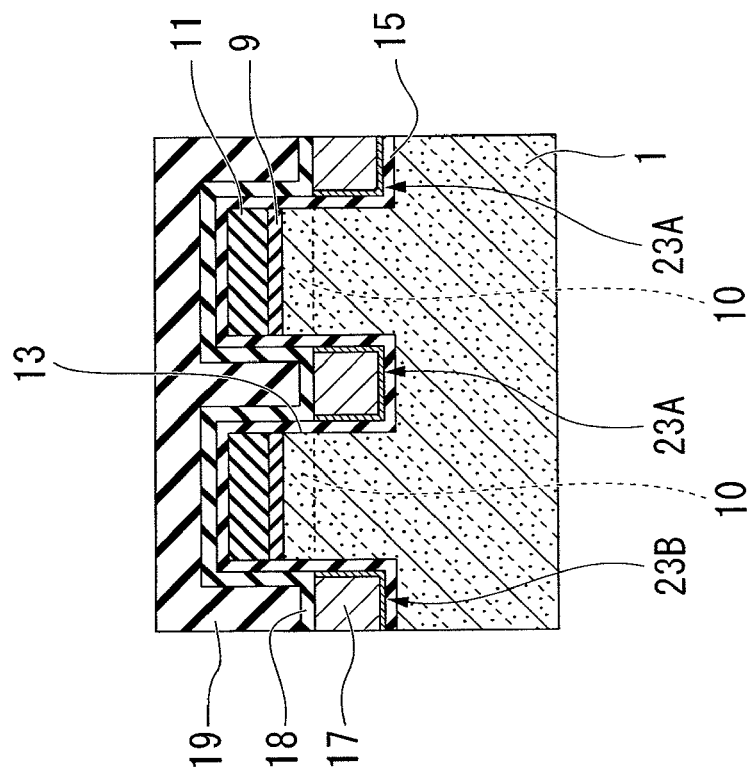
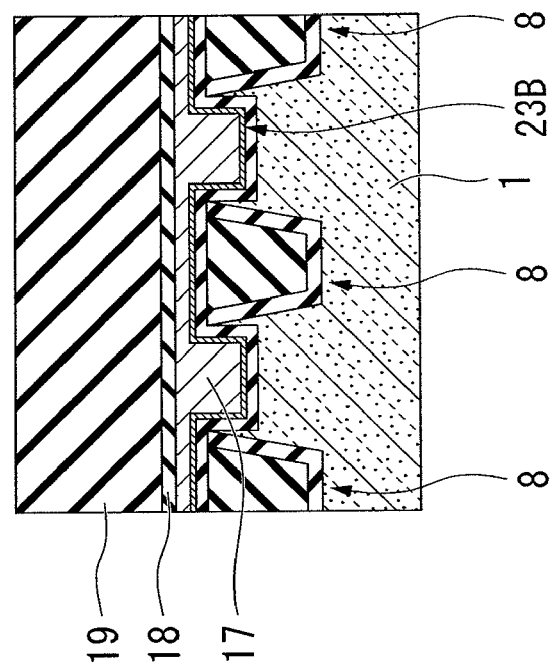
FIG. 11A
FIG. 11B

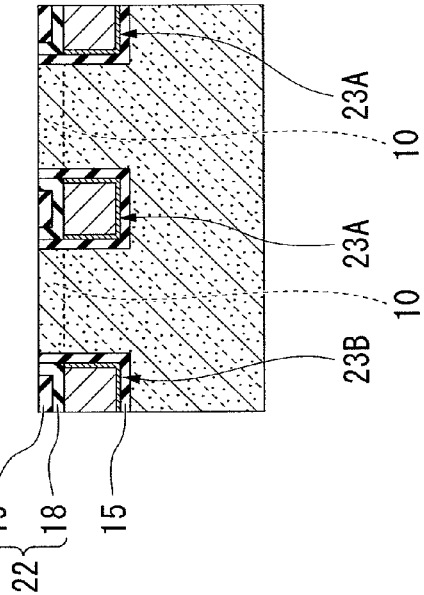
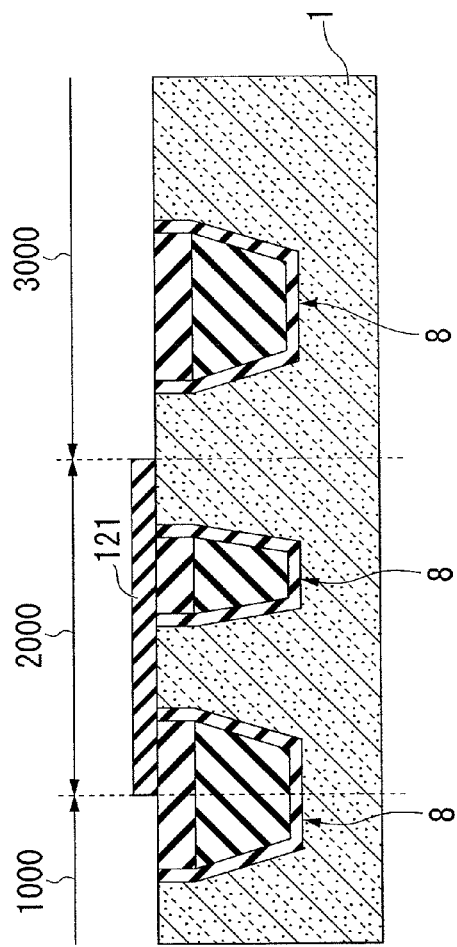
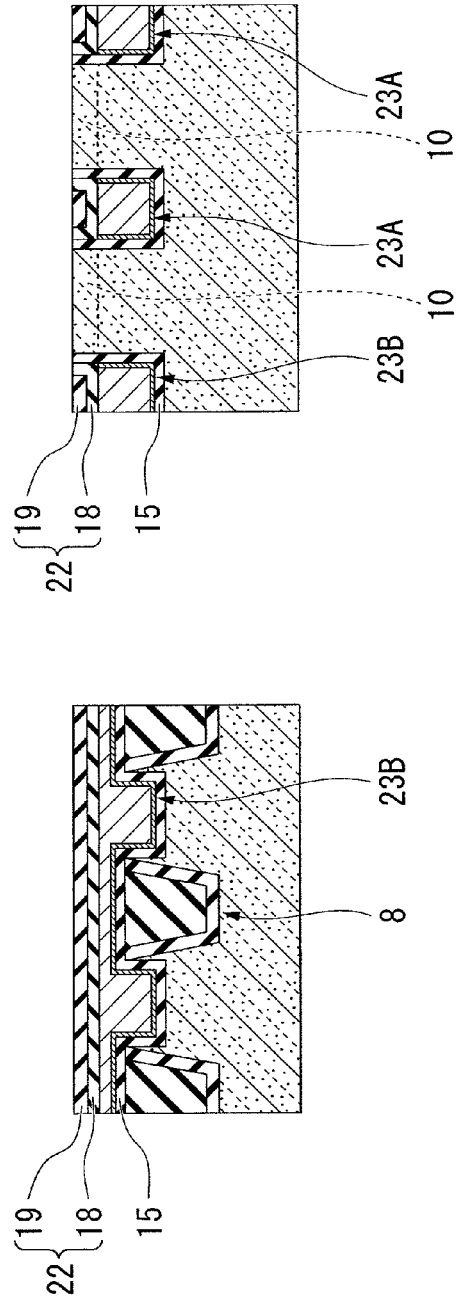

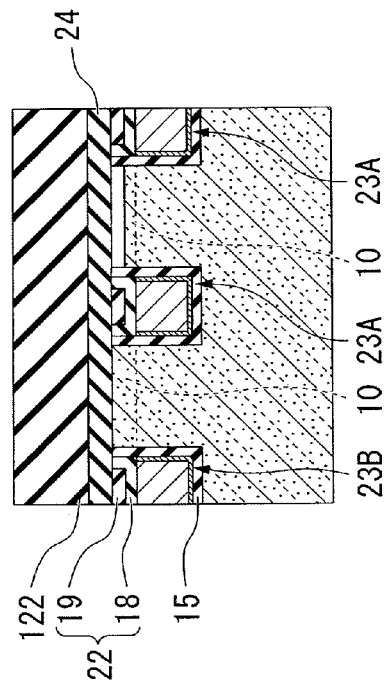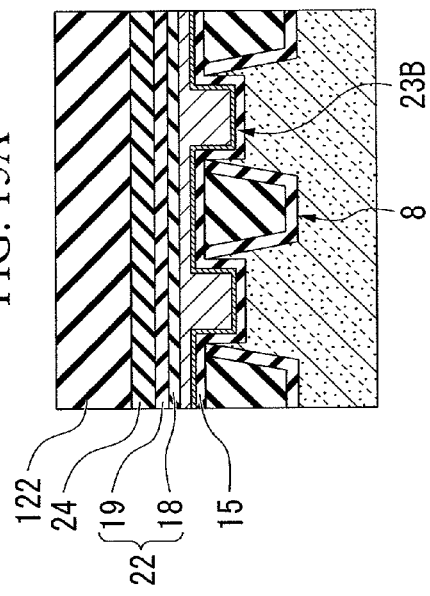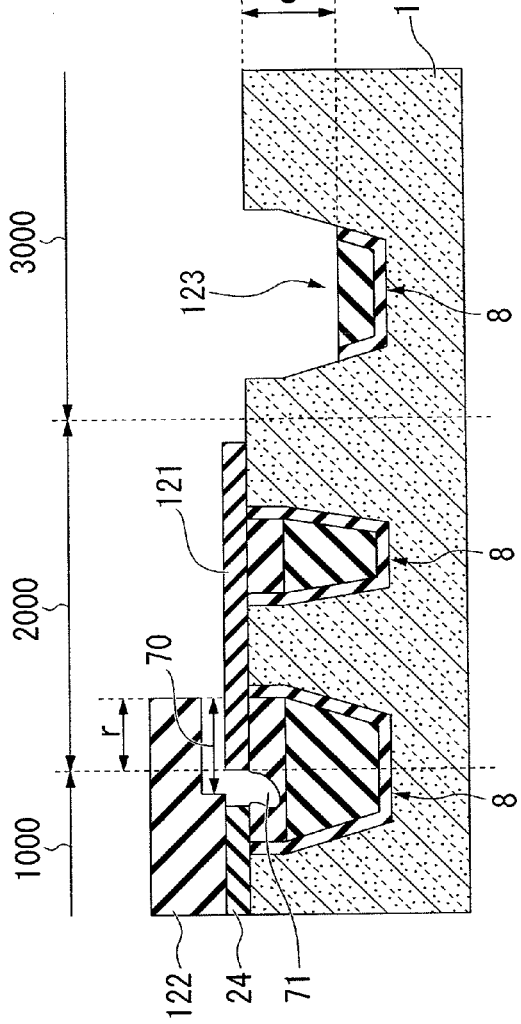

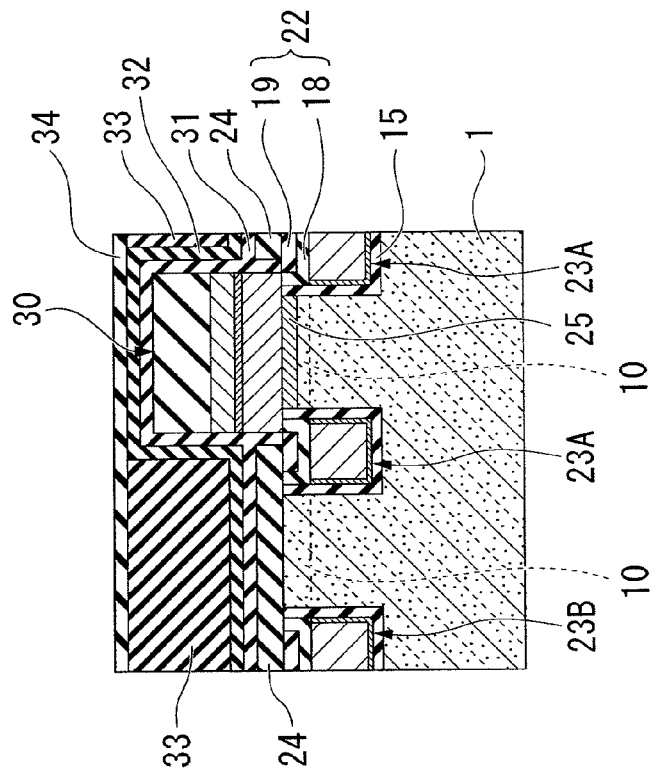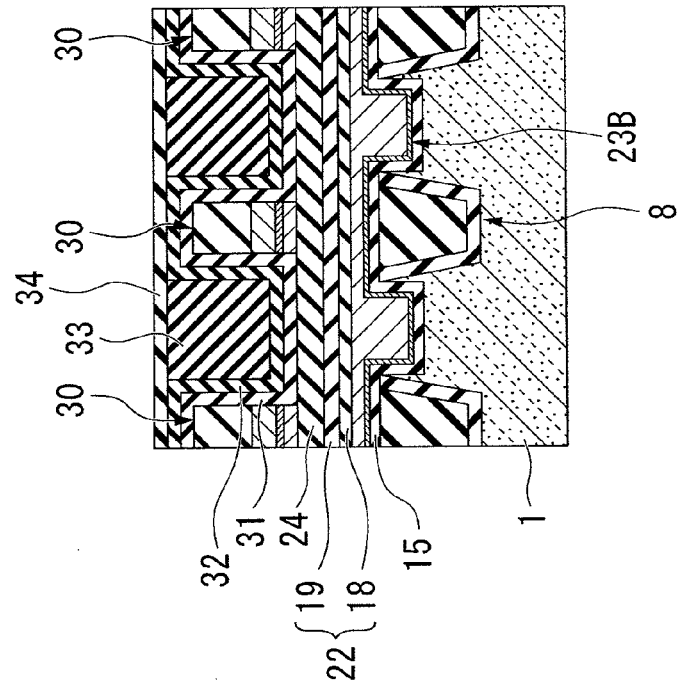

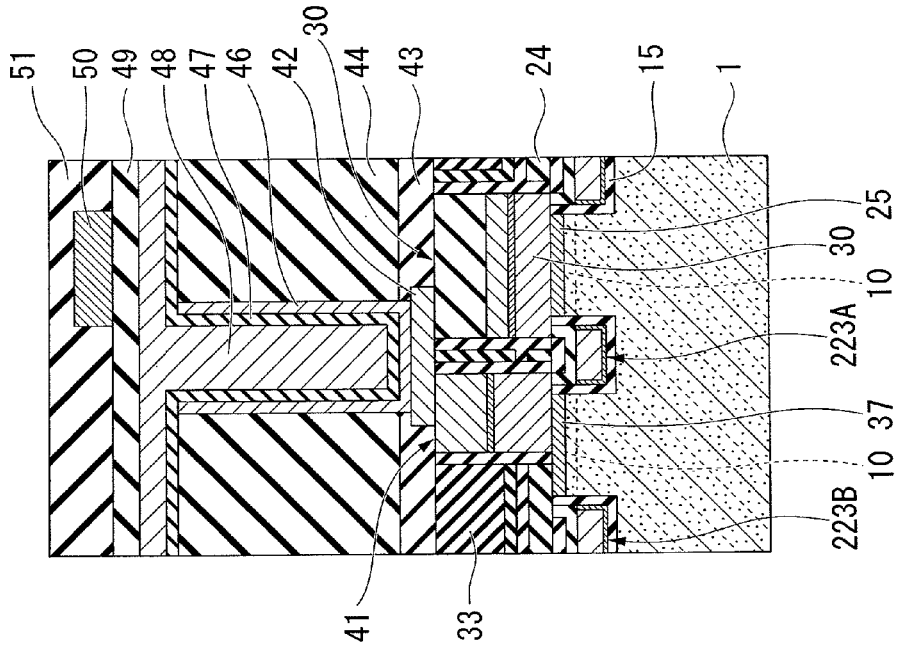
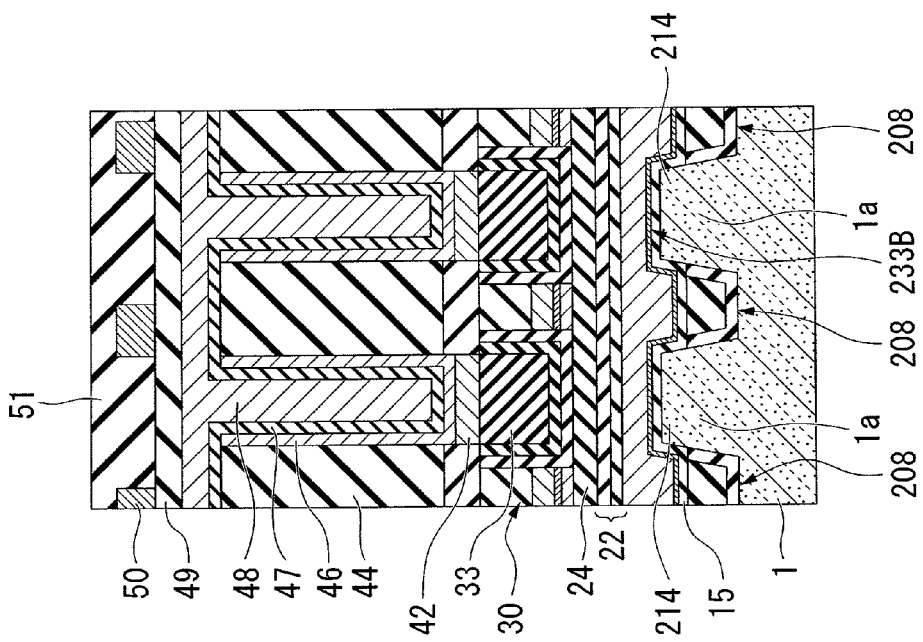

METHOD OF FORMING A SEMICONDUCTOR DEVICE AN ALIGNMENT MARK FORMED IN A GROOVE

BACKGROUND OF THE INVENTION

1. Field of the Invention

The present invention generally relates to a method of forming a semiconductor device.

Priority is claimed on Japanese Patent Application No. 2009-287802, Dec. 18, 2009, the content of which is incorporated herein by reference.

2. Description of the Related Art

In transistors with a planar structure in which a substrate surface is used as a channel in the related art, the miniaturization of semiconductor devices has led to difficulty in suppressing a short channel effect, and desired transistor characteristics cannot be obtained.

Japanese Unexamined Patent Application, First Publications, Nos. JP-A-2006-339476 and JP-A-2007-081095 disclose using groove gate transistors to suppress the short channel effect.

In the groove gate transistors described in Japanese Unexamined Patent Application, First Publication, No. JP-A-2006-339476 and JP-A-2007-081095, surfaces of grooves formed in a semiconductor substrate are used as channels. Increase in the depth dimension of the groove can suppress the short channel effect, even the horizontal dimensions of the groove are decreased.

SUMMARY

In one embodiment, a method of forming a semiconductor device may include, but is not limited to, the following processes. A first groove is formed in a semiconductor substrate. An insulating film is formed in the first groove. An interlayer insulating film is formed over the semiconductor substrate. A removing process is performed to remove a part of the interlayer insulating film and a part of the insulating film to form an alignment mark in the first groove.

In another embodiment, a method of forming a semiconductor device may include, but is not limited to, the following processes. A first groove is formed in an alignment area of a semiconductor substrate. An insulating film is formed in the first groove. A semiconductor film is formed in a peripheral circuit area of the semiconductor substrate. An interlayer insulating film is formed over the semiconductor film and the insulating film. A resist film that partially overlaps the semiconductor film is formed. An etching process that etches the interlayer insulating film and the insulating film is performed. The etching process includes removing the interlayer insulating film in the peripheral circuit area to form a gap between the resist film and the semiconductor film in the peripheral circuit area. The etching process further includes removing the interlayer insulating film and the insulating film in the alignment mark area to form a second groove in the first groove in the alignment mark area. The interlayer insulating film in the peripheral circuit area is removed while the interlayer insulating film and the insulating film in the alignment mark area is removed.

In still another embodiment, a method of forming a semiconductor device may include, but is not limited to, the following processes. A first groove and a second groove are formed in a semiconductor substrate. An insulating film is formed in the first groove and the second groove. A semiconductor film is formed over at least the first groove. An interlayer insulating film is formed over the semiconductor film and the insulating film in the first groove and the second groove. A resist film that covers the first groove is formed. An etching process is performed to etch the interlayer insulating film and the insulating film is performed. The etching process includes removing the interlayer insulating film over the first groove to form a gap between the resist film and the semiconductor film and removing the interlayer insulating film and the insulating film over the second groove to form a third groove in the second groove. The interlayer insulating film over the first groove is removed while the interlayer insulating film and the insulating film over the second groove is removed.

BRIEF DESCRIPTION OF THE DRAWINGS

The above features and advantages of the present invention will be more apparent from the following description of certain preferred embodiments taken in conjunction with the accompanying drawings, in which:

FIG. 6A is a fragmentary cross sectional elevation view, taken along an A-A' line of FIG. 1, illustrating a memory cell in a step, subsequent to the step of FIGS. 5A and 5B, involved in the method of forming the semiconductor device of FIGS. 1, 2A and 2B;

FIG. 6B is a fragmentary cross sectional elevation view, taken along a B-B' line of FIG. 1, illustrating a memory cell in a step, subsequent to the step of FIGS. 5A and 5B, involved in the method of forming the semiconductor device of FIGS. 1, 2A and 2B;

FIG. 9A is a fragmentary cross sectional elevation view, taken along an A-A' line of FIG. 1, illustrating a memory cell in a step, subsequent to the step of FIGS. 8A and 8B, involved in the method of forming the semiconductor device of FIGS. 1, 2A and 2B;

FIG. 9B is a fragmentary cross sectional elevation view, taken along a B-B' line of FIG. 1, illustrating a memory cell in a step, subsequent to the step of FIGS. 8A and 8B, involved in the method of forming the semiconductor device of FIGS. 1, 2A and 2B;

FIG. 11A is a fragmentary cross sectional elevation view, taken along an A-A' line of FIG. 1, illustrating a memory cell in a step, subsequent to the step of FIGS. 10A and 10B, involved in the method of forming the semiconductor device of FIGS. 1, 2A and 2B;

FIG. 11B is a fragmentary cross sectional elevation view, taken along a B-B' line of FIG. 1, illustrating a memory cell in a step, subsequent to the step of FIGS. 10A and 10B, involved in the method of forming the semiconductor device of FIGS. 1, 2A and 2B;

FIG. 12A is a fragmentary cross sectional elevation view, taken along an A-A' line of FIG. 1, illustrating a memory cell in a step, subsequent to the step of FIGS. 11A and 11B, involved in the method of forming the semiconductor device of FIGS. 1, 2A and 2B;

FIG. 12B is a fragmentary cross sectional elevation view, taken along a B-B' line of FIG. 1, illustrating a memory cell in a step, subsequent to the step of FIGS. 11A and 11B, involved in the method of forming the semiconductor device of FIGS. 1, 2A and 2B;

FIG. 12C is a fragmentary cross sectional elevation view, illustrating a memory cell area, a peripheral circuit area, and an alignment mark area, subsequent to the step of FIGS. 11A and 11B, involved in the method of forming the semiconductor device of FIGS. 1, 2A and 2B;

FIG. 15A is a fragmentary cross sectional elevation view, taken along an A-A' line of FIG. 1, illustrating a memory cell in a step, subsequent to the step of FIGS. 14A, 14B, and 14C involved in the method of forming the semiconductor device of FIGS. 1, 2A and 2B;

FIG. 15B is a fragmentary cross sectional elevation view, taken along a B-B' line of FIG. 1, illustrating a memory cell in a step, subsequent to the step of FIGS. 14A, 14B, and 14C involved in the method of forming the semiconductor device of FIGS. 1, 2A and 2B;

FIG. 15C is a fragmentary cross sectional elevation view, illustrating a memory cell area, a peripheral circuit area, and an alignment mark area, subsequent to the step of FIGS. 14A, 14B, and 14C, involved in the method of forming the semiconductor device of FIGS. 1, 2A and 2B;

FIG. 20A is a fragmentary cross sectional elevation view, taken along an A-A' line of FIG. 1, illustrating a memory cell in a step, subsequent to the step of FIGS. 19A and 19B, involved in the method of forming the semiconductor device of FIGS. 1, 2A and 2B;

FIG. 20B is a fragmentary cross sectional elevation view, taken along a B-B' line of FIG. 1, illustrating a memory cell in a step, subsequent to the step of FIGS. 19A and 19B, involved in the method of forming the semiconductor device of FIGS. 1, 2A and 2B;

FIG. 29A is a fragmentary cross sectional elevation view, taken along an A-A' line of FIG. 1, illustrating a memory cell in a step, illustrating another embodiment of the present invention;

FIG. 29B is a fragmentary cross sectional elevation view, taken along a B-B' line of FIG. 1, illustrating a memory cell in a step, illustrating another embodiment of the present invention;

DETAILED DESCRIPTION OF THE PREFERRED EMBODIMENTS

Figure 1:
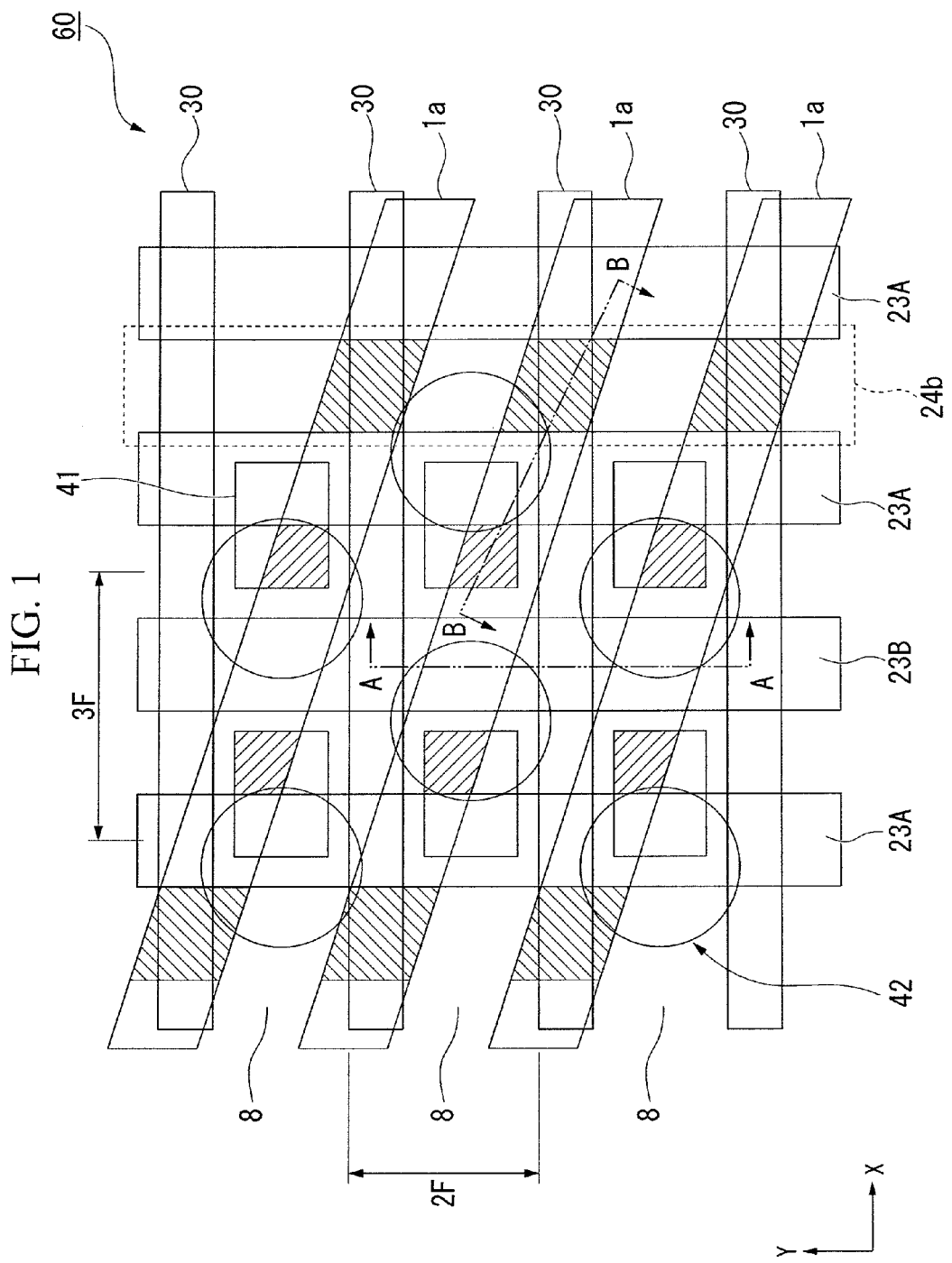
FIG. 1 is a fragmentary plan view illustrating a semiconductor device in accordance with one embodiment of the present invention.

Before describing the present invention, the related art will be explained in detail, in order to facilitate the understanding of the present invention.

In the groove gate transistors in the related art described in JP-A-2006-339476 and JP-A-2007-081095, gate electrodes protrude above the surface of the semiconductor substrate. Deterioration in transistor characteristics may be caused by misaligning the gate electrodes with respect to the groove. Particularly, a DRAM (Dynamic Random Access Memory) may have a configuration in which the gate electrodes are used as word lines and bit lines provided in a direction intersecting with the word lines. In this case, contact plugs connecting the semiconductor substrate to upper layer lines are formed between the word lines formed respectively in a minimum processing dimension. Difficulty in forming the contact plugs is a significant obstacle in miniaturization of the DRAM.

Accordingly, to easily form the contact plugs, embedded gate transistors have been examined. The gate electrodes are completely embedded in grooves without protruding above the surface of the semiconductor substrate. In the embedded gate transistors, the word lines are embedded in the semiconductor substrate. Accordingly, only the bit lines as lines constituting memory cells are positioned above the surface of the semiconductor substrate. There is an advantage that it is possible to reduce the difficulty in processing in a memory cell forming process. The embedded gate transistor includes at least gate electrodes (word lines), a cap insulating film, and bit lines. The gate electrodes (word lines) are formed to be embedded in grooves formed in the semiconductor substrate. A cap insulating film protects upper faces of the gate electrode in the grooves and has an upper face substantially flush with the surface of the semiconductor substrate. The bit lines are formed on the upside with an interlayer insulating film covering the surface of the semiconductor substrate interposed therebetween.

In the embedded gate structure, after the embedded gate electrodes are formed, the bit lines are formed by a process of forming an interlayer insulating film above the substrate and a process of forming bit contact holes in the interlayer insulating film. To form the bit contact holes in the interlayer insulating film with high precision, a lithography process capable of carrying out alignment using alignment marks is generally used.

As the alignment marks, a pattern is used, which is formed of an STI element isolation film provided on the surface of the substrate of an alignment mark area 3000 positioned outside a memory cell area 1000 and a peripheral circuit area 2000. To perform the alignment using the pattern, it is necessary to expose the alignment marks to the surface of the substrate and to make the pattern reliably recognizable at the time of alignment by providing a sufficient level difference between the upper face of the STI element isolation film and the upper face of the substrate.

To form the alignment marks to be exposed to the surface of the substrate, a layer provided on the upper face of the STI element isolation film in the alignment mark area 3000 has to be removed to be exposed while protecting the upper face of the memory cell area 1000 and the peripheral circuit area 2000. An insulating film constituting the STI element isolation film has to be removed until it is a predetermined height.

As described above, to form the bit lines, it is necessary to provide a photoresist forming process only for exposing the alignment marks used at the time of forming the bit contact holes in the interlayer insulating film.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of forming a semiconductor device may include, but is not limited to, the following processes. A first groove is formed in a semiconductor substrate. An insulating film is formed in the first groove. An interlayer insulating film is formed over the semiconductor substrate. A removing process is performed to remove a part of the interlayer insulating film and a part of the insulating film to form an alignment mark in the first groove.

In some cases, removing process may include, but is not limited to, forming a level difference between an upper face of the semiconductor substrate and an upper face of the insulating film in the first groove.

In some cases, forming the level difference may be, but is not limited to, at least 100 nm.

In some cases, the forming the insulating film may include, but is not limited to, the following process. A first silicon oxide film is formed on an inside wall of the first groove. A silicon nitride film partially filling the first groove is formed. A second silicon oxide film is formed over the silicon nitride. The second silicon oxide film is in the first groove. The removing may include the following process. A part of the interlayer insulating film in a horizontal direction is removed while a part of the first silicon oxide film, a part of the silicon nitride film, and a part of the second silicon oxide film is removed in a vertical direction.

In some cases, the method may further include, but is not limited to, forming a resist film over the interlayer insulating film.

In some cases, the method may further include, but is not limited to, forming a semiconductor film over the semiconductor substrate before forming the interlayer insulating film. The semiconductor film and the resist film partially overlap each other by an overlapping width that depends on the level difference.

In some cases, the method may further include, but is not limited to, the following processes. A gate electrode groove is formed in the semiconductor substrate A gate electrode is formed in the gate electrode groove.

In some cases, the removing process may include, but is not limited to, forming the alignment mark and a bit contact opening portion in the interlayer insulating film.

In some cases, the method may further include, but is not limited to, the following processes. A second groove is formed in a memory cell area of the semiconductor substrate. A resist film is formed over the interlayer insulating film that overlaps the second groove after forming the interlayer insulating film. The forming the first silicon oxide film may include the following processes. The first silicon oxide film is formed on the inside face of the first groove and on an inside face of the second groove. A silicon nitride film is formed in the first groove and the second groove. A second silicon oxide film is formed over the silicon nitride film. The removing process may further include removing the second silicon oxide film in the first groove while removing a part of the second silicon oxide film in the second groove to form a recessed portion in the second silicon oxide film in the second groove.

In some cases, the method may further include, but is not limited to, the following processes. A second groove is formed in a memory cell area of the semiconductor substrate. A resist film is formed over the interlayer insulating film that overlaps the second groove after forming the interlayer insulating film. The forming the first silicon oxide film may include the following processes. The first silicon oxide film is formed on an inside face of the first groove and on an inside face of the second groove. A silicon nitride film is formed in the groove and the second groove. A second silicon oxide film is formed over the silicon nitride film. The removing process may include removing the interlayer insulating film in the first groove and in the second groove to expose a surface of the second silicon oxide film in the second groove.

In another embodiment, a method of forming a semiconductor device may include, but is not limited to, the following processes. A first groove is formed in an alignment area of a semiconductor substrate. An insulating film is formed in the first groove. A semiconductor film is formed in a peripheral circuit area of the semiconductor substrate. An interlayer insulating film is formed over the semiconductor film and the insulating film. A resist film that partially overlaps the semiconductor film is formed. An etching process is performed to etch the interlayer insulating film and the insulating film. The etching process may include the following processes. The interlayer insulating film in the peripheral circuit area to form a gap between the resist film and the semiconductor film in the peripheral circuit area is removed. The interlayer insulating film and the insulating film in the alignment mark area is removed to form a second groove in the first groove in the alignment mark area. The interlayer insulating film in the peripheral circuit area is removed while the interlayer insulating film and the insulating film in the alignment mark area is removed.

In some cases, the forming the insulating film may include, but is not limited to, the following processes. A silicon oxide film is formed over the semiconductor substrate. A silicon nitride film is formed over the silicon oxide film.

In some cases, the etching process may be performed, but is not limited to, to form a level difference between an upper face of the semiconductor substrate and an upper face of the insulating film in the first groove.

In some cases, the level difference may be, but is not limited to, at least 100 nm.

In some cases, the semiconductor film and the resist film may partially overlap each other, but is not limited to, by an overlapping width that depends on the level difference.

In still another embodiment, a method of forming a semiconductor device may include, but is not limited to, the following processes. A first groove and a second groove are formed in a semiconductor substrate. An insulating film is formed in the first groove and the second groove. A semiconductor film is formed over at least the first groove. An interlayer insulating film is formed over the semiconductor film and the insulating film in the first groove and the second groove. A resist film that covers the first groove is formed. An etching process is performed to etch the interlayer insulating film and the insulating film. The etching process may include the following processes. The interlayer insulating film over the first groove is removed to form a gap between the resist film and the semiconductor film. The interlayer insulating film and the insulating film over the second groove is removed to form a third groove in the second groove. The interlayer insulating film over the first groove is removed while the interlayer insulating film and the insulating film over the second groove is removed.

In some cases, the forming the insulating film may include, but is not limited to, the following processes. A silicon oxide film is formed over the semiconductor substrate. A silicon nitride film is formed over the silicon oxide film.

In some cases, the etching process may be performed, but is not limited to, to form a level difference between an upper face of the semiconductor substrate and an upper face of the insulating film in the first groove.

In some cases, the level difference may be, but is not limited to, at least 100 nm.

In some cases, the semiconductor film and the resist film may partially overlap each other, but is not limited to, by an overlapping width that depends on the level difference.

Hereinafter, in one embodiment, a DRAM (Dynamic Random Access Memory) as the semiconductor device will be described. In the drawings used for the following description, to facilitate understanding of the embodiments, illustrations are partially enlarged and shown, and the sizes and ratios of constituent elements are not limited to being the same as the actual dimensions. Materials, sizes, and the like exemplified in the following description are just examples, and the invention is not limited thereto and may be appropriately modified within the scope which does not deviate from the embodiments.

First, a configuration of a DRAM (semiconductor device) according to an embodiment of the invention will be described. The DRAM of the embodiment includes a memory cell area shown in FIG. 1, a peripheral circuit area (not shown), and an alignment mark area (not shown) provided in a peripheral area of the memory cell area and the peripheral circuit area.

As shown in FIG. 1, in the memory cell area of the DRAM (semiconductor device) 60 of the embodiment, a plurality of active areas 1a portioned and surrounded with the element isolation area formed of an STI element isolation film 8 is formed at a predetermined interval in a predetermined direction. Embedded gate electrodes 23A, which are word lines, and an element isolation embedded line 23B are embedded at a predetermined interval in a predetermined direction (Y direction shown in FIG. 1) to longitudinally cross the active areas 1a. A plurality of bit lines 30 is provided in a direction (X direction shown in FIG. 1) perpendicular to the embedded gate electrodes 23A and the embedded line 23B. Memory cells are formed in areas where the embedded gate electrodes 23A intersect the active areas 1a.

The embedded gate electrodes (word lines) 23A and the embedded line 23B have the same structure, but different functions. The embedded gate electrodes 23A are used as gate electrodes of the memory cells. On the contrary, the element isolation embedded line 23B is provided to isolate adjacent transistors from each other over a predetermined potential. That is, the element isolation embedded line 23B is kept at a predetermined voltage to turn off a parasitic transistor, such that the adjacent transistors in the same active area 1a are isolated from each other.

In the whole memory cell area 1000, in which the plurality of memory cells is formed, each memory cell is provided with a capacitor element (not shown). As shown in FIG. 1, such capacitance contact pads 42 are provided at a predetermined interval in the memory cell area 1000 so as not to overlap with each other.

As shown in FIG. 1, the DRAM 60 of the embodiment is provided in $6F^2$ cell disposition where F is a minimum processing size.

Next, the memory cells constituting the DRAM 60 of the embodiment will be described.

Figure 2A:
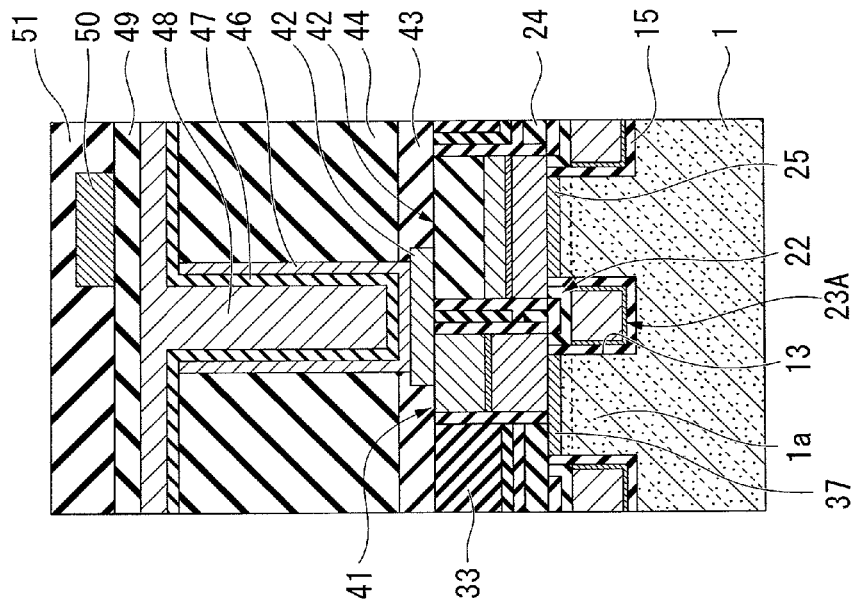
FIG. 2A is a fragmentary cross sectional elevation view, taken along an A-A' line of FIG. 1, illustrating a memory cell in the semiconductor device of FIG. 1.
Figure 2B:
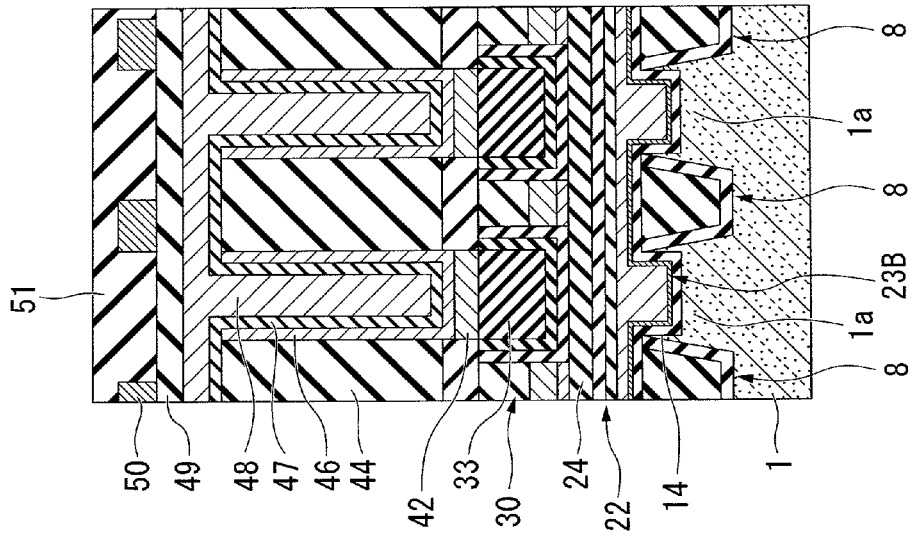
FIG. 2B is a fragmentary cross sectional elevation view, taken along a B-B' line of FIG. 1, illustrating a memory cell in the semiconductor device of FIG. 1.

As shown in FIG. 2A and FIG. 2B, the memory cell of the embodiment has a laminated film structure which includes transistors with embedded gates being completely embedded in the semiconductor substrate, capacitors, and wiring layers. The transistor with the embedded gate will hereinafter be referred to as embedded gate transistor. The embedded gate is formed of a part of a word line.

As shown in FIG. 2A and FIG. 2B, the embedded gate transistor schematically includes a semiconductor substrate 1, an STI element separation film 8, an active area 1a, an embedded gate electrode 23A, a cap insulating film 22, and a bit line 30. The semiconductor substrate 1 has a surface layer formed of silicon. The STI element separation film 8 is formed of an embedded insulating film formed in the semiconductor substrate 1. The active area 1a is partitioned by the STI element isolation film 8. The embedded gate electrode 23A is embedded with a gate insulating film 15 interposed therebetween at the bottom of a gate electrode groove 13. The cap insulating film 22 is embedded in the gate electrode groove 13 to protect the upper face of the gate electrode 23A and having an upper face substantially flush with the surface of the semiconductor substrate 1. The bit line 30 formed above with a first interlayer insulating film (interlayer insulating film) 24 covering the surface of the semiconductor substrate 1 interposed therebetween.

The embedded gate transistor is provided with diffusion areas 25 and 37. The diffusion areas 25 and 37 are formed by injecting ions to the active areas 1a on both widthwise sides of the embedded gate electrode 23A. The embedded gate transistor is connected to the diffusion area 25 and the bit line 30.

As shown in FIG. 2A, in the embedded gate transistor of the embodiment, a part of the bottom face of the embedded line 23B is embedded between the adjacent STI element isolation films 8 provided in a lengthwise direction of the embedded line 23B. Accordingly, a thin film silicon portion 14 is formed in a side-wall shape between the STI element isolation film 8 and a partial side face of the bottom face where the embedded line 23B is embedded.

Since the embedded gate electrode 23A and the embedded line 23B have the same structure, the same thin film silicon portion 14 is also provided on a partial bottom face of the embedded gate electrode 23A. The thin film silicon portion 14 can serve as a channel when a potential difference between a source area and a drain area exceeds a threshold value. As described above, the embedded gate transistor of the embodiment constitutes a recess channel type transistor having a channel area such as the thin film silicon portion 14.

A capacitor is provided above the embedded gate transistor with an insulating film 33 and the like interposed therebetween. Specifically, a capacitance contact pad 42 connected to a diffusion area 37 of the embedded gate transistor through a capacitance contact plug 41 is provided over the insulating film 33. A capacitor is formed over the capacitance contact pad 42, which includes a lower electrode 46, a capacitance insulating film 47, and an upper electrode 48 provided to pass through a stopper film 43 and a third interlayer insulating film 44.

A cylinder type using only an inner wall of the lower electrode 46 as an electrode is described as an example of the capacitor element of the embodiment, but it is not limited thereto. For example, it may be modified into a crown type capacitor using an inner wall and an outer wall of the lower electrode as the electrode.

The wiring layer is provided over the capacitor with a fourth insulating film 49 interposed therebetween, and includes upper metal lines 50 and a protective film 51. In the embodiment, a case where the wiring layer is a one-layer line structure is described as an example, but it is not limited thereto. For example, it may be modified into a multi-layer line structure formed of a plurality of wiring layers and interlayer insulating films.

Subsequently, a method of manufacturing the DRAM (semiconductor device) 60 having the above-described configuration will be described with reference to FIG. 3A to FIG. 26B. FIG. 3A to FIG. 26B are views for describing the method of manufacturing the DRAM of the embodiment.

FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, and 26A each show a cross-sectional structure of the part taken along the line A-A' shown in FIG. 1, and FIGS. 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, and 26B each show a cross-sectional structure of the part taken along the line B-B' shown in FIG. 1.

FIGS. 12C, 13C, 14C, and FIG. 15C each show cross-sectional views over the memory cell area 1000, the peripheral circuit area 2000, and the alignment mark area 3000.

The method of manufacturing the DRAM (semiconductor device) 60 of the embodiment schematically includes a process of forming element isolation areas, a process of forming embedded gate electrodes, a process of forming bit lines, a process of forming capacitance contact plugs, a process of forming capacitors, and a process of forming a wiring layer.

More specifically, the method of manufacturing the DRAM 60 of the embodiment includes the following processes. An element isolation area is formed of the embedded insulating films in the semiconductor substrate. A silicon film over the semiconductor substrate is formed in the memory cell area. A gate electrode groove is formed in the semiconductor substrate. A gate insulating films is formed over the inner walls of the gate electrode groove. The inside of the gate electrode groove is filled with a gate electrode material, and etch-back is performed. An embedded gate electrode is formed at the bottoms of the gate electrode groove. The inside of the gate electrode groove is filled with insulating films to cover the upper face of the embedded gate electrode, and etch-back is performed. Then cap insulating film is formed at the upper portion of the gate electrodes groove. An interlayer insulating film is formed on the upper face of the semiconductor substrate. Bit contact opening portion is formed in the interlayer insulating film. Between the process of forming the interlayer insulating film on the upper face of the semiconductor substrate and the process of forming the bit contact opening portions in the interlayer insulating film, the silicon film of the peripheral circuit area 2000 and the surface of the substrate are exposed, and an alignment mark is formed in the alignment mark area 3000.

Hereinafter, the processes will be described in detail.

(Process of Forming Element Isolation Areas)

Figure 3B:
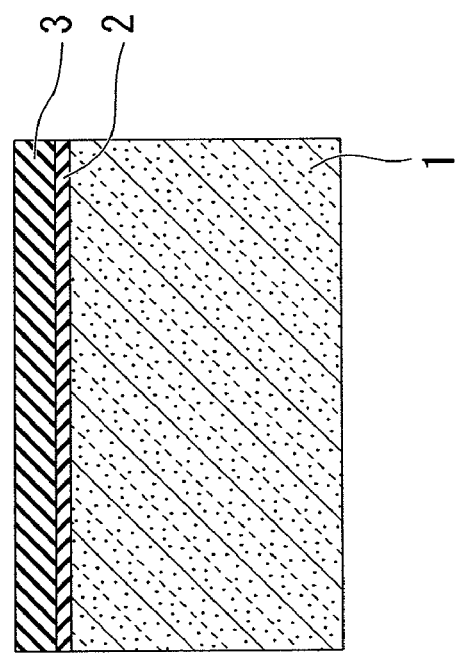
FIG. 3B is a fragmentary cross sectional elevation view, taken along a B-B' line of FIG. 1, illustrating a memory cell in a step involved in a method of forming the semiconductor device of FIGS. 1, 2A and 2B.
Figure 3A:
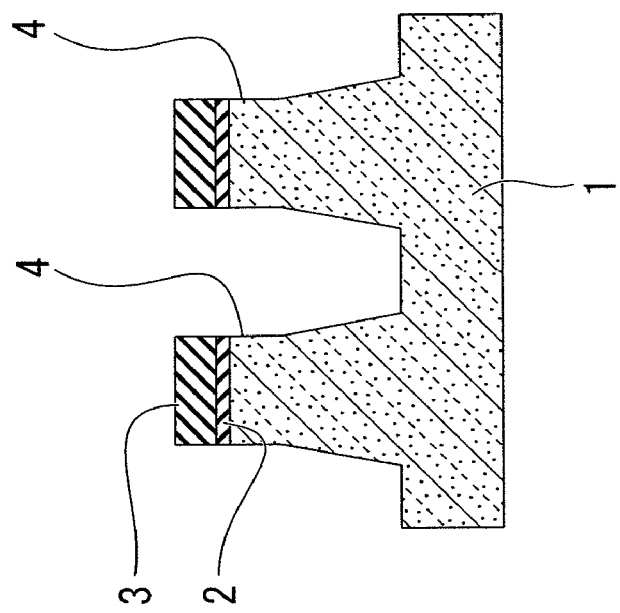
FIG. 3A is a fragmentary cross sectional elevation view, taken along an A-A' line of FIG. 1, illustrating a memory cell in a step involved in a method of forming the semiconductor device of FIGS. 1, 2A and 2B.

First, the element isolation area for isolating an active area 1a are formed on a surface of a silicon substrate (semiconductor substrate) 1. As shown in FIG. 3A and FIG. 3B, for example, the element isolation area is formed by sequentially laminating a silicon oxide film ($SiO_2$) 2 and a mask silicon nitride film ($Si_3N_4$) 3 over the P type silicon substrate (semiconductor substrate) 1. Then, patterning processes of a silicon nitride film 3, a silicon nitride film 2, and the silicon substrate 1 are performed in sequence using a photolithography technique and a dry etching technique to form element isolation grooves (trenches) 4 for partitioning the active areas 1a over the silicon substrate 1. The silicon surface, which becomes the active areas 1a, of the silicon substrate 1 is covered with the mask silicon nitride film 3.

Figure 4B:
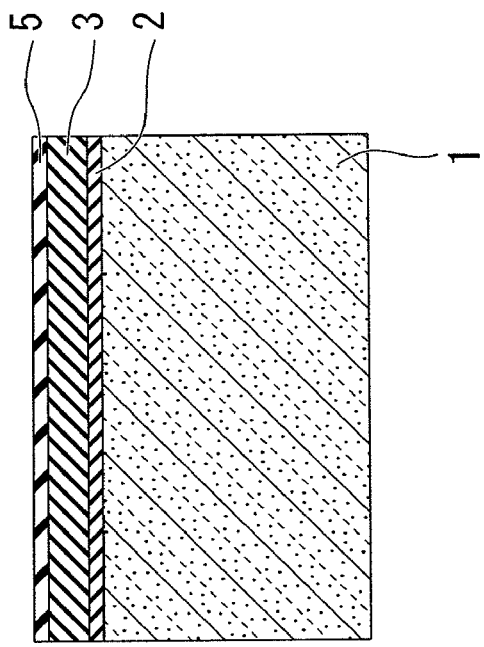
FIG. 4B is a fragmentary cross sectional elevation view, taken along a B-B' line of FIG. 1, illustrating a memory cell in a step, subsequent to the step of FIGS. 3A and 3B, involved in the method of forming the semiconductor device of FIGS. 1, 2A and 2B.
Figure 4A:
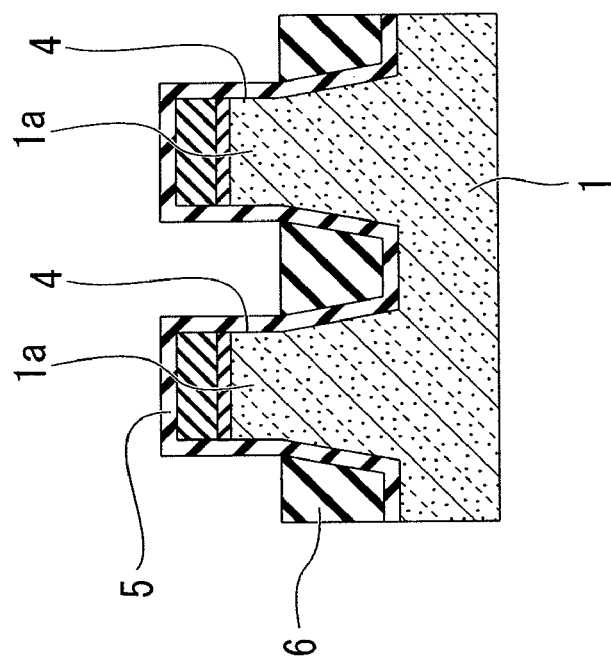
FIG. 4A is a fragmentary cross sectional elevation view, taken along an A-A' line of FIG. 1, illustrating a memory cell in a step, subsequent to the step of FIGS. 3A and 3B, involved in the method of forming the semiconductor device of FIGS. 1, 2A and 2B.

Then, as shown in FIG. 4A and FIG. 4B, a silicon oxide film 5 is formed on the surface of the silicon substrate 1 exposed into the element isolation grooves 4. Specifically, the silicon oxide film 5 is formed by thermal oxidation on the surface of the silicon oxide film 2 and the silicon nitride film 3 coating the active areas 1a of the silicon substrate 1 together with the surface of the silicon substrate 1 in the element isolation grooves 4. Then, silicon nitride is laminated to fill the insides of the element isolation grooves 4, etch-back is performed. A silicon nitride film 6 is allowed to remain at the bottom in the element isolation grooves 4.

Figure 5B:
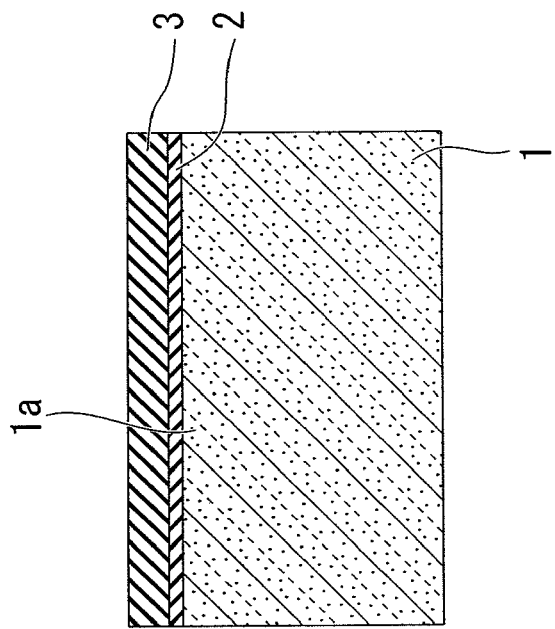
FIG. 5B is a fragmentary cross sectional elevation view, taken along a B-B' line of FIG. 1, illustrating a memory cell in a step, subsequent to the step of FIGS. 4A and 4B, involved in the method of forming the semiconductor device of FIGS. 1, 2A and 2B.
Figure 5A:
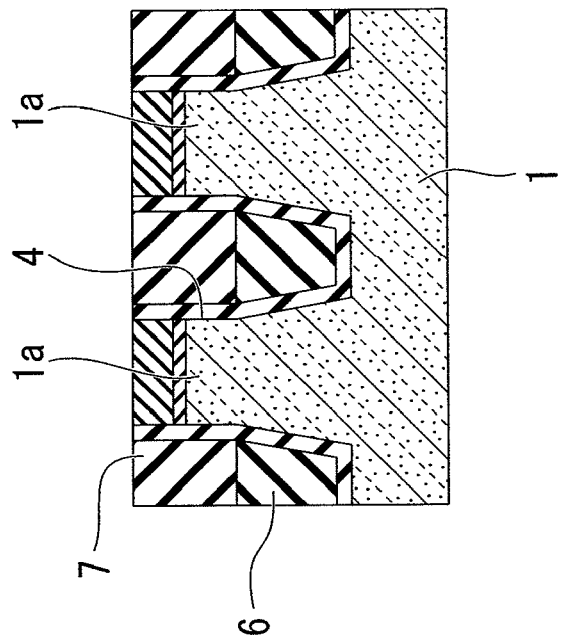
FIG. 5A is a fragmentary cross sectional elevation view, taken along an A-A' line of FIG. 1, illustrating a memory cell in a step, subsequent to the step of FIGS. 4A and 4B, involved in the method of forming the semiconductor device of FIGS. 1, 2A and 2B.

Then, as shown in FIG. 5A and FIG. 5B, silicon oxide is laminated to fill the insides of the element isolation grooves 4 by, for example, a CVD method. Subsequently, CMP is performed to planarize the surface of the substrate until the mask silicon nitride film 3 is exposed, thereby forming a silicon oxide film 7. As described above, the insides of the element isolation grooves 4 are filled with the 2-layer structure of the lower-layer silicon nitride film 6 and the upper layer silicon oxide film 7. It is possible to reliably fill the insides of the element isolation grooves 4 with the insulating film even when widths of the element isolation grooves 4 are very small.

Then, as shown in FIG. 6A and FIG. 6B, the mask silicon nitride film 3 and the silicon oxide film 2 are removed by, for example, wet etching. Thus, the surface (i.e., the surface of the silicon oxide film 7) of the element isolation groove 4 and the surface of the silicon substrate 1 become substantially flush with each other. In such a manner, STI (Shallow Trench Isolation) element isolation film 8 constituting the element isolation area is formed. The active areas 1a are partitioned in the silicon substrate 1 by the element isolation area.

Then, an impurity diffusion layer is formed on the surface of the silicon substrate 1. The impurity diffusion layer is formed as follows. First, as shown in FIG. 6A and FIG. 6B, a silicon oxide film 9 is formed on the surface of the exposed silicon substrate 1 by thermal oxidation. Then, low-concentration N type impurities (phosphorus, etc.) are injected to the active areas 1a of the silicon substrate 1 by ion injection, using the silicon oxide film 9 as a mask. In such a manner, an N type impurity diffusion layer 10 is formed in the vicinity of the surface of the silicon substrate 1. The N type impurity diffusion layer 10 serves as a part of source and drain areas of the transistors.

Then, a silicon film formed of polysilicon is formed over the silicon substrate 1 over the memory cell areas 1000, the peripheral circuit area 2000, and the alignment mark area 3000. Thereafter, the silicon film provided outside of the peripheral circuit area 2000 is removed to form a silicon film (a polysilicon film 121 shown in FIG. 12C to be described later) only over the silicon substrate 1 of the peripheral circuit area 2000.

(Process of Forming Embedded Gate Electrodes)

Figure 7B:
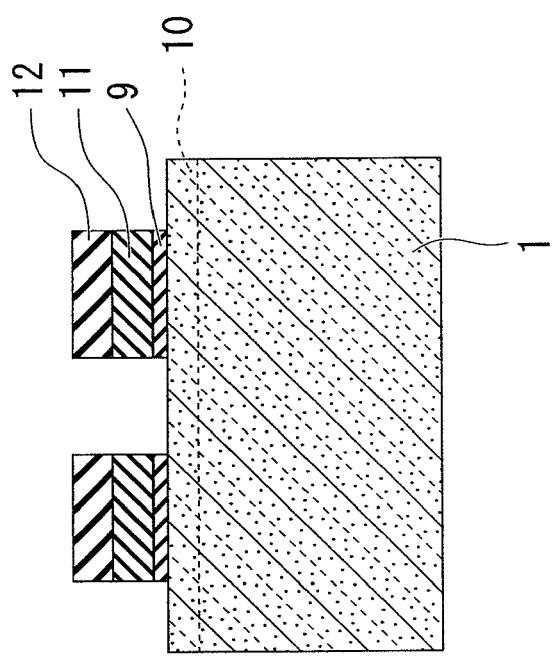
FIG. 7B is a fragmentary cross sectional elevation view, taken along a B-B' line of FIG. 1, illustrating a memory cell in a step, subsequent to the step of FIGS. 6A and 6B, involved in the method of forming the semiconductor device of FIGS. 1, 2A and 2B.
Figure 7A:
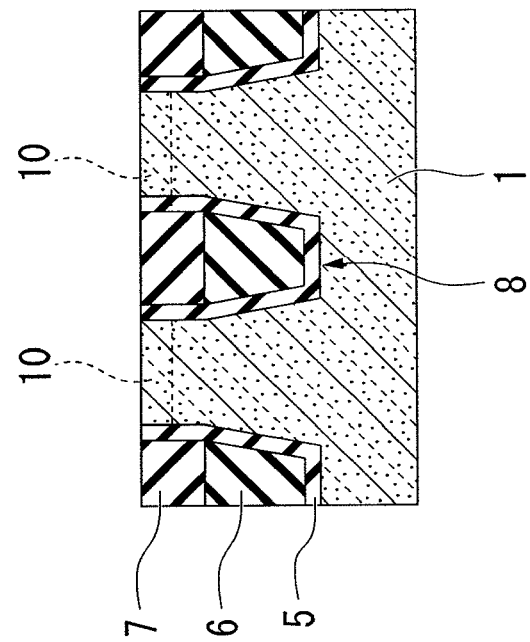
FIG. 7A is a fragmentary cross sectional elevation view, taken along an A-A' line of FIG. 1, illustrating a memory cell in a step, subsequent to the step of FIGS. 6A and 6B, involved in the method of forming the semiconductor device of FIGS. 1, 2A and 2B.

Next, an embedded gate electrode (word line) is formed. The embedded gate electrode is formed as follows. First, as shown in FIG. 7A and FIG. 7B, a mask silicon nitride film 11 and a carbon film (amorphous carbon film) 12 are sequentially laminated over the silicon oxide film 9. The carbon film 12, the silicon nitride film 11, and the silicon oxide film 9 are sequentially patterned to form a hard mask for forming a gate electrode groove (trench).

Figure 8B:
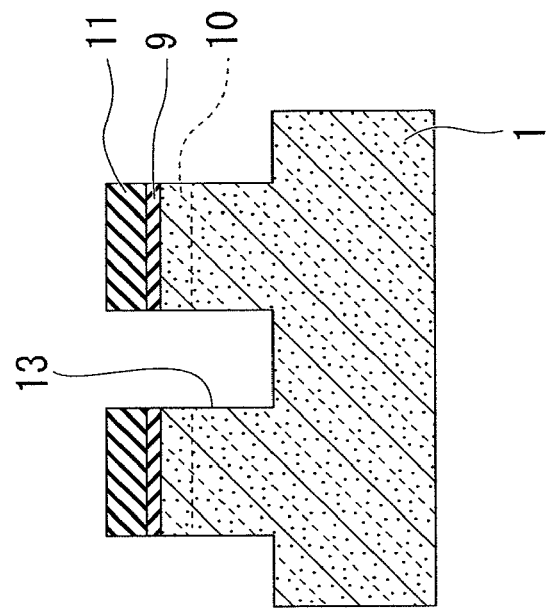
FIG. 8B is a fragmentary cross sectional elevation view, taken along a B-B' line of FIG. 1, illustrating a memory cell in a step, subsequent to the step of FIGS. 7A and 7B, involved in the method of forming the semiconductor device of FIGS. 1, 2A and 2B.
Figure 8A:
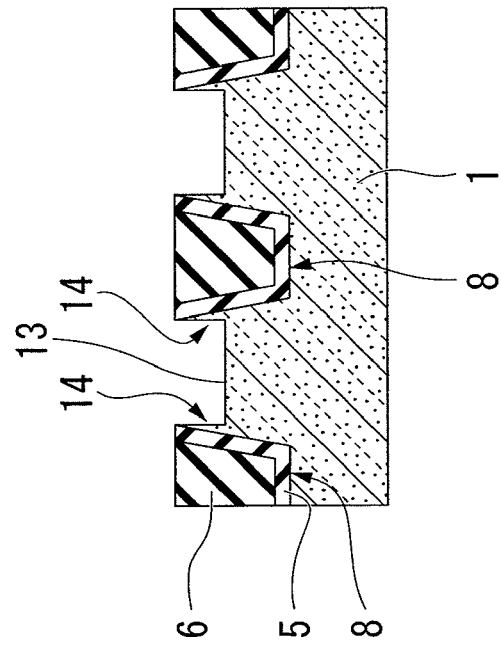
FIG. 8A is a fragmentary cross sectional elevation view, taken along an A-A' line of FIG. 1, illustrating a memory cell in a step, subsequent to the step of FIGS. 7A and 7B, involved in the method of forming the semiconductor device of FIGS. 1, 2A and 2B.

Then, as shown in FIG. 8A and FIG. 8B, the silicon substrate 1 exposed from the hard mask is etched by dry etching, and thus the gate electrodes groove (trench) 13 is formed. The gate electrodes grooves 13 are formed as a linear pattern extending in a predetermined direction (e.g., the Y direction in FIG. 1) intersecting with the active areas 1a. As shown in FIG. 8A, when the gate electrode grooves 13 are formed, part of the silicon layer is etched deeper than part of the STI element isolation film 8 such that the surface of the STI element isolation film 8 is higher than the silicon substrate 1. Accordingly, a thin film silicon portion 14 having a side-wall shape remains on the side parts of the gate electrode grooves 13 being in contact with the STI element isolation films 8. The thin film silicon portion 14 serves as the channel area of the transistor.

Then, as shown in FIG. 9A and FIG. 9B, a gate insulating film 15 is formed to cover the inner wall face of the gate electrode groove 13 and the surface of the substrate. As the gate insulating film 15, for example, a silicon oxide film formed by thermal oxidation or the like may be used. Then, gate electrode materials are sequentially laminated over the gate insulating film 15 to fill the gate electrodes 13. Specifically, using titanium nitride (TiN) and tungsten (W) as the gate electrode materials, for example, the gate electrode grooves 13 are filled with a titanium nitride film 16 and a tungsten film 17.

In the method of forming the gate electrode in the related art, conductive polysilicon has been used at a part being in contact with the gate insulating film 15. However, when the polysilicon is used for the miniaturized embedded gate electrodes, a resistance of the gate electrodes becomes high, which is not preferable. Accordingly, in the embodiment, the gate electrode grooves 13 are filled only with titanium nitride and tungsten without using polysilicon.

Figure 10B:
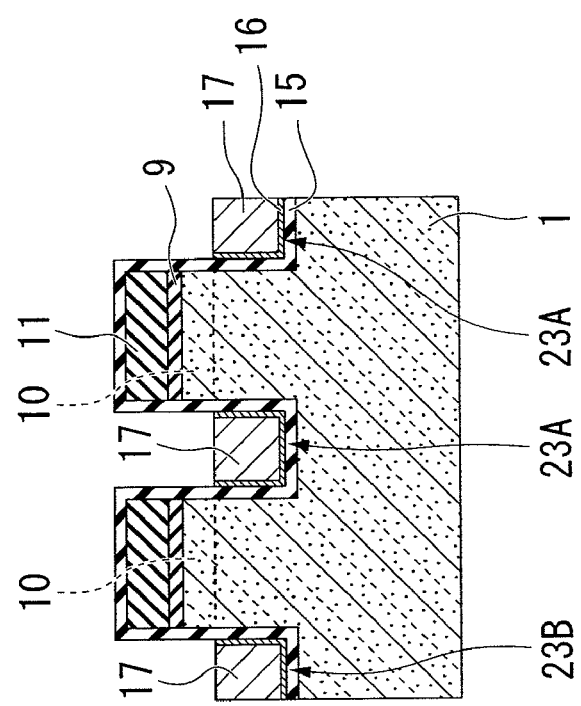
FIG. 10B is a fragmentary cross sectional elevation view, taken along a B-B' line of FIG. 1, illustrating a memory cell in a step, subsequent to the step of FIGS. 9A and 9B, involved in the method of forming the semiconductor device of FIGS. 1, 2A and 2B.
Figure 10A:
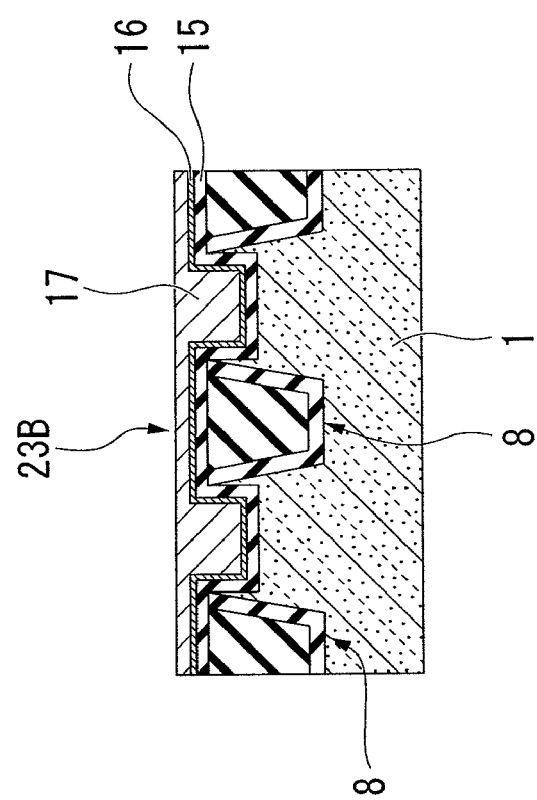
FIG. 10A is a fragmentary cross sectional elevation view, taken along an A-A' line of FIG. 1, illustrating a memory cell in a step, subsequent to the step of FIGS. 9A and 9B, involved in the method of forming the semiconductor device of FIGS. 1, 2A and 2B.

Then, as shown in FIG. 10A and FIG. 10B, etch-back is performed on the titanium nitride film 16 and the tungsten film 17 formed to fill the inside of the gate electrode groove 13. The titanium nitride film 16 and the tungsten film 17 are allowed to remain only at the bottoms of the gate electrode grooves 13. In such a manner, the embedded gate electrode (word line) 23A and the embedded line 23B are formed to fill the inside of the gate electrode groove 13 formed in the silicon substrate 1. To embed the gate electrode, the degree of the etch-back is adjusted such that the upper face of the tungsten film 17 constituting the embedded gate electrodes 23A in the gate electrode grooves 13 is positioned lower (deeper) than the silicon layer of the silicon substrate 1.

Then, as shown in FIG. 11A and FIG. 11B, a linear film 18 is formed of, for example, a silicon nitride film or the like to cover the upside of the remaining tungsten film 17 and the inner walls of the gate electrodes grooves 13. Then, an embedded insulating film 19 is formed over the linear film 18. As the embedded insulating film 19, for example, a silicon oxide film formed by a CVD method, an SOD (Spin On Dielectric) film that is a coating film, and a laminated film thereof may be used. When the SOD film is used as the embedded insulating film 19, the SOD film is applied onto the linear film 18. Then an annealing process is performed in an atmosphere of high temperature water vapor ($H_2O$) to reform it into a solid film.

Then, as shown in FIG. 12A and FIG. 12B, a CMP process is performed, the surface of the substrate is planarized until the linear film 18 formed over the mask silicon nitride film 11 is exposed. Thereafter, the mask silicon nitride film 11 and a part of the embedded insulating film 19 and the linear film 18 are removed by etching (etch-back) to expose the silicon surface of the silicon substrate 1. In such a manner, a cap insulating film 22 formed of the linear film 18 and the embedded insulating film 19 is formed above the embedded gate electrode (word line) 23A and the embedded line 23B.

As shown in FIG. 12C, in the peripheral circuit area 2000 after forming the cap insulating film 22, a polysilicon film (silicon film) 121 used to form a planar type MOS transistor is exposed on the substrate.

(Process of Forming First Interlayer Insulating Film)

Next, a first interlayer insulating film (interlayer insulating film) 24 is formed. The first interlayer insulating film 24 is formed as follows. As shown in FIG. 13C, the first interlayer insulating film 24 formed of, for example, a CVD oxide film or the like is formed to cover the whole surface of the substrate, that is, the memory cell areas 1000, the peripheral circuit area 2000, and the whole surface of the alignment mark area 3000.

More specifically, in the peripheral circuit area 2000, the first interlayer insulating film 24 is formed to cover the surface of the polysilicon film 121 provided over the upper face of the silicon substrate.

Figure 13A:
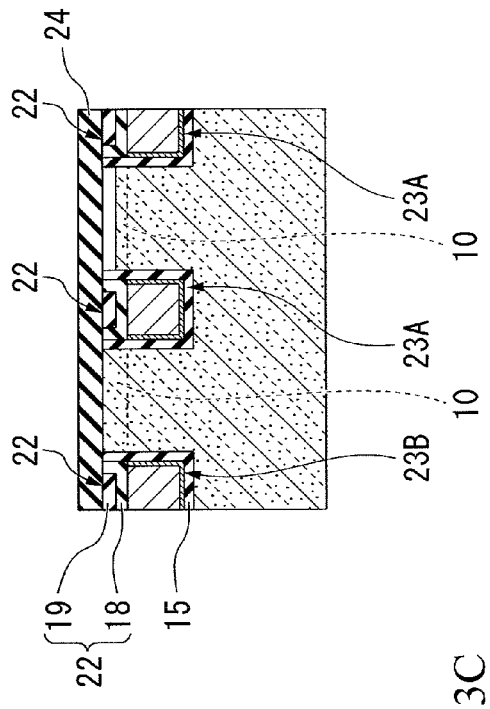
FIG. 13A is a fragmentary cross sectional elevation view, taken along an A-A' line of FIG. 1, illustrating a memory cell in a step, subsequent to the step of FIGS. 12A, 12B, and 12C, involved in the method of forming the semiconductor device of FIGS. 1, 2A and 2B.
Figure 13B:
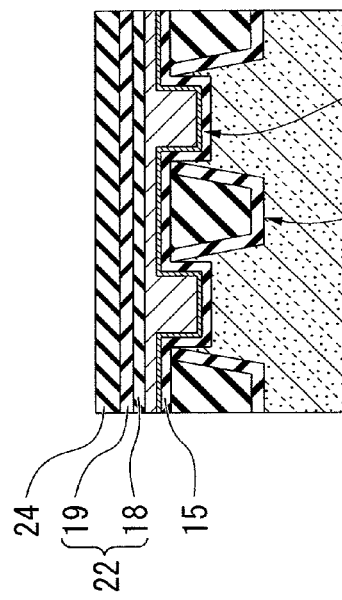
FIG. 13B is a fragmentary cross sectional elevation view, taken along a B-B' line of FIG. 1, illustrating a memory cell in a step, subsequent to the step of FIGS. 12A and 12B, involved in the method of forming the semiconductor device of FIGS. 1, 2A and 2B.
Figure 13C:
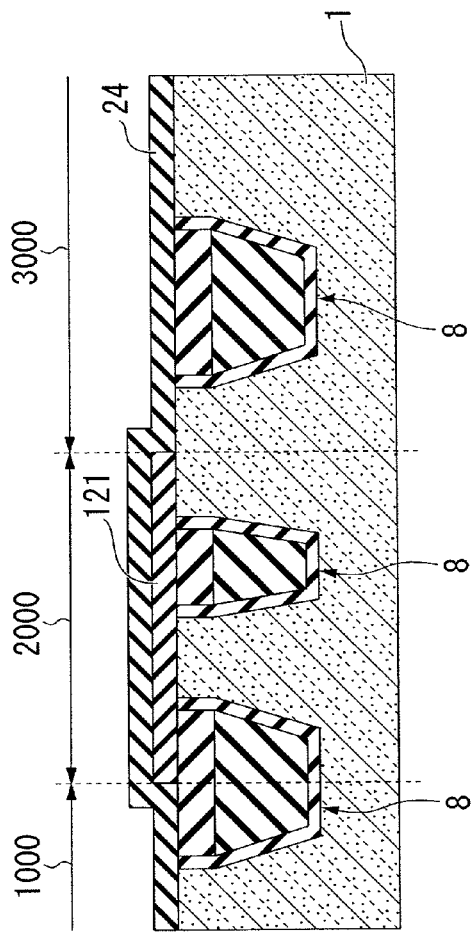
FIG. 13C is a fragmentary cross sectional elevation view, illustrating a memory cell area, a peripheral circuit area, and an alignment mark area, subsequent to the step of FIGS. 12A, 12B, and 12C, involved in the method of forming the semiconductor device of FIGS. 1, 2A and 2B.

In the memory cell area 1000, as shown in FIG. 13A and FIG. 13B, the first interlayer insulating film 24 is formed to cover the surface of the silicon substrate 1 and the surface of the cap insulating film 22.

(Process of Exposing Peripheral Circuit Area)

Figure 14A:
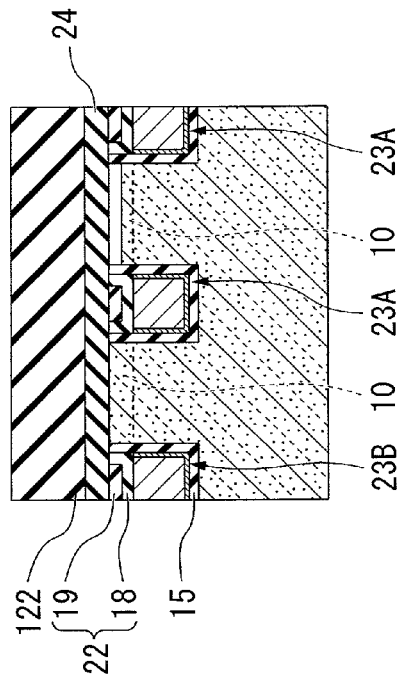
FIG. 14A is a fragmentary cross sectional elevation view, taken along an A-A' line of FIG. 1, illustrating a memory cell in a step, subsequent to the step of FIGS. 13A, 13B, and 13C, involved in the method of forming the semiconductor device of FIGS. 1, 2A and 2B.
Figure 14B:
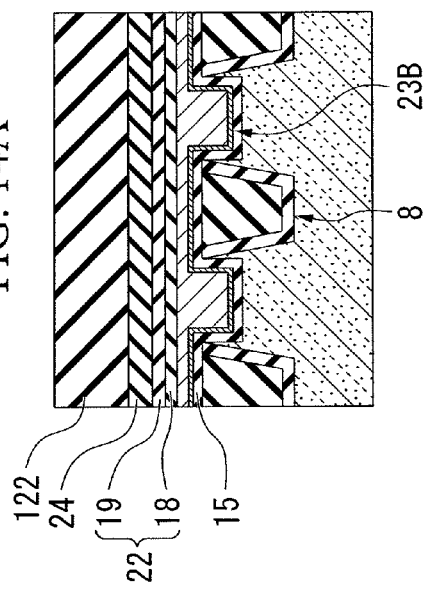
FIG. 14B is a fragmentary cross sectional elevation view, taken along a B-B' line of FIG. 1, illustrating a memory cell in a step, subsequent to the step of FIGS. 13A, 13B, and 13C involved in the method of forming the semiconductor device of FIGS. 1, 2A and 2B.

Then, the polysilicon film 121 of the peripheral circuit area 2000 and a part of the surface of the substrate are exposed. Specifically, as shown in FIG. 14A and FIG. 14B, a resist film 122 is formed to coat the first interlayer insulating film 24 formed in the memory cell areas 1000. The first interlayer insulating film 24 formed in the peripheral circuit area 2000 and the alignment mark area 3000 is exposed as shown in FIG. 14C.

Figure 14C:
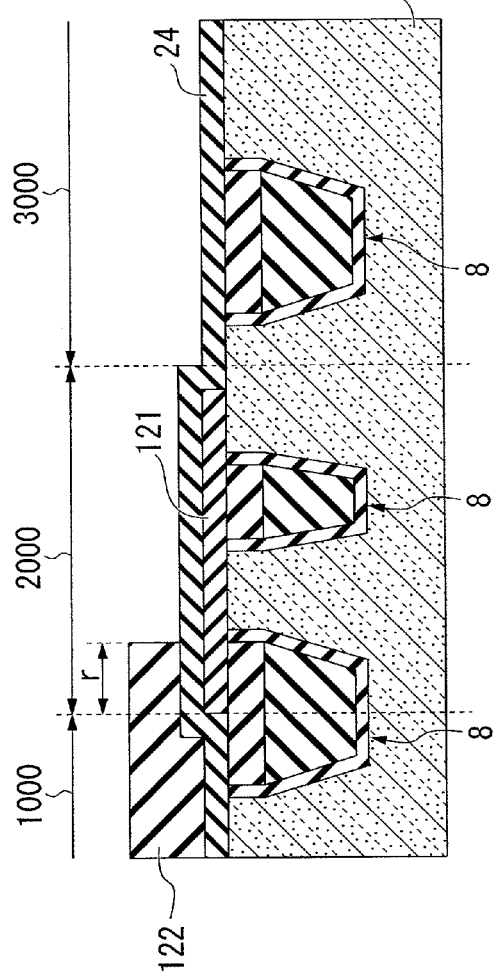
FIG. 14C is a fragmentary cross sectional elevation view, illustrating a memory cell area, a peripheral circuit area, and an alignment mark area, subsequent to the step of FIGS. 13A, 13B, and 13C, involved in the method of forming the semiconductor device of FIGS. 1, 2A and 2B.

In the embodiment, as shown in FIG. 14C, it is preferable to form the resist film 122 to cover the upper face of the polysilicon film 121 of the peripheral circuit area 2000 adjacent to the memory cell area 1000 up to a predetermined width. Specifically, the resist film 122 is formed to overlap only a width r of the upper face of the polysilicon film 121 from a boundary line with respect to the memory cell area 1000 to the peripheral circuit area 2000 side.

The width r from the boundary line with respect to the memory cell area 1000 is not particularly limited as long as the memory cell area 1000 can be sufficiently protected at the etching time. Specifically, the width r may be, for example, 400 nm.

Accordingly, when the first insulating film 24 to be described later is removed and when the upper face of the STI element isolation film 8 is removed, etching liquid can be prevented from excessively infiltrating into the first interlayer insulating film 24 coating the memory cell area 1000.

Then, as shown in FIG. 15C, a wet etching process is carried out as follows. The wet etching process is performed in conditions where the first interlayer insulating film 24, the silicon oxide film 5, the silicon nitride film 6, and the silicon oxide film 7 are etched while the polysilicon film 121 is not substantially etched. The wet etching process is performed using the resist film 122 as a mask. First, the first interlayer insulating film 24 is etched so that the first interlayer insulating film 24 is removed in the peripheral circuit area 2000 and in the alignment mark area 3000 while the first interlayer insulating film 24 is not removed in the memory cell area 1000. Then, the first interlayer insulating film 24 coating the peripheral circuit area 2000 is removed in a horizontal direction 70 to form a special gap between overlapping portions of the resist film 122 and the polysilicon film 121. The special gap extends in the horizontal direction 70. While the special gap is formed in the peripheral circuit region, the silicon oxide film 7 is etched in the alignment mark area 3000 and the silicon oxide film 7 is not etched in the memory cell area 1000 and the peripheral circuit area 2000. As the etching process further progresses, the silicon nitride film 6 and the silicon oxide film 5 in the alignment mark area 3000 are etched to form an alignment mark 123 having a depth d. On the other hand, in the memory cell area 1000, the silicon oxide film 7 is etched to form a recessed portion 71 in the silicon oxide film 7 while the silicon nitride film 6 being covered by the silicon oxide film 7. The silicon nitride layer 6 in the alignment mark area 3000 is removed while the silicon nitride layer 6 in the memory cell area 1000 is not etched. In other case, the silicon oxide film 7 in the in the memory cell area 1000 may not be etched without forming the recessed portion 71. The first interlayer insulating film 24 coating the peripheral circuit area 2000 and the alignment mark area 3000 exposed from the resist film 122 is removed. Accordingly, the polysilicon film 121 and a part of the surface of the substrate are exposed in the peripheral circuit area 2000. In the alignment mark area 3000, the surface of the silicon substrate 1 and the upper face of the STI element isolation film 8 formed of the embedded insulating film formed over the silicon substrate 1 are exposed. As shown in FIG. 15A and FIG. 15B, the first interlayer insulating film 24 of the memory cell area 1000 is protected by the resist film 122.

Then, the alignment mark 123 for forming, for example, a bit contact opening portion is formed. In the embodiment, a part of the STI element isolation film 8 provided in the alignment mark area 3000 is used as the alignment mark. Specifically, as shown in FIG. 15C, the alignment mark 123 is formed in a manner that a part of the embedded insulating film constituting the STI element isolation film 8 is etched. The part of the embedded insulating film is removed to form a level difference between the upper face of the silicon substrate 1 and the upper face of the STI element isolation film 8.

In the embodiment, in a lithography process, to clearly recognize the alignment mark 123, it is preferable that a height d of the level difference provided between the upper face of the silicon substrate 1 and the upper face of the STI element isolation film 8 is at least 100 nm, and preferably 400 nm.

Since the level difference is provided by a degree of the etching process of the embedded insulating film constituting the STI element isolation film 8, it is preferable to change the width r by which the polysilicon film 121 of the peripheral circuit area 2000 is coated with the resist film 122 depending on the height d of the level difference.

That is, by sufficiently securing the width r by which the polysilicon film 121 of the peripheral circuit area 2000 is coated with the resist film 122, it is possible to etch the upper face of the STI element isolation film 8 until the height d of the level difference becomes high enough over the alignment mark area 3000 while reliably protecting the memory cell area 1000 at the time of forming the alignment mark.

As shown in FIG. 15C, even when the upside of the polysilicon film 121 formed in the peripheral circuit area 2000 to protect the memory cell area 1000 is coated with the resist film 122 and when the etching time at the time of forming the alignment mark 123 is long, there is a case where the upper face of the STI element isolation film 8 provided at an interface part of the memory cell area 1000 and the peripheral circuit area 2000 is etched.

In the method of manufacturing the DRAM 60 of the embodiment, a process of exposing the polysilicon film 121 provided on the surface of the silicon substrate 1 of the peripheral circuit area 2000 and the surface of the substrate is provided between the process of forming the first interlayer insulating film 24 on the upper face of the silicon substrate 1 and a process of forming a bit contact opening portion 24*a* in the first interlayer insulating film 24 to be described later. While exposing the surface of the peripheral circuit area 2000, the alignment mark is formed in the alignment mark area 3000 using the resist film 122 used in this process. For this reason, it is possible to remove the photolithography process provided separately from the process of exposing the peripheral circuit and the process of exposing the alignment mark in the related art. Accordingly, it is possible to reduce manufacturing cost by reducing the number of processes.

(Process of Forming Bit Contact Opening Portion)

Figure 16A:
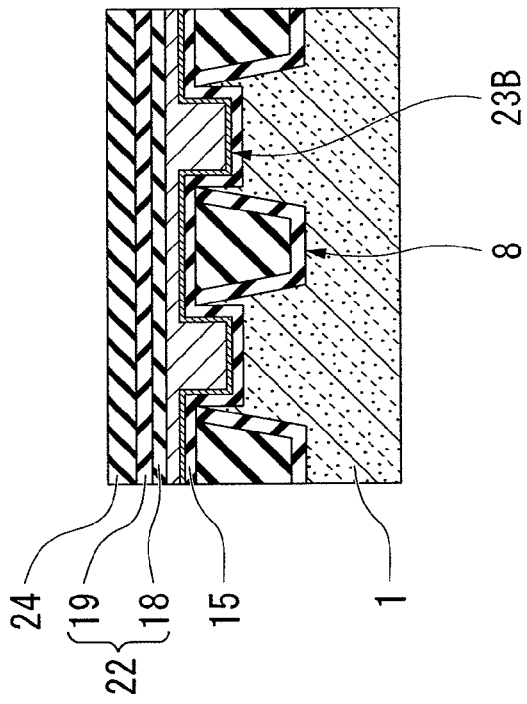
FIG. 16A is a fragmentary cross sectional elevation view, taken along an A-A' line of FIG. 1, illustrating a memory cell in a step, subsequent to the step of FIGS. 15A, 15B, and 15C involved in the method of forming the semiconductor device of FIGS. 1, 2A and 2B.
Figure 16B:
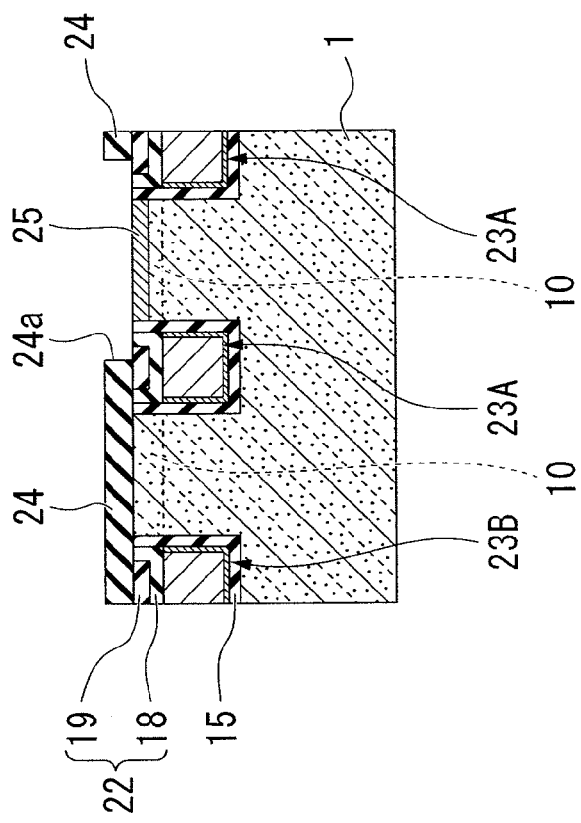
FIG. 16B is a fragmentary cross sectional elevation view, taken along a B-B' line of FIG. 1, illustrating a memory cell in a step, subsequent to the step of FIGS. 15A, 15B, and 15C involved in the method of forming the semiconductor device of FIGS. 1, 2A and 2B.

Next, as shown in FIG. 16A and FIG. 16B, a part of the first interlayer insulating film 24 is removed using a photolithography technique and a dry etching technique, to form a bit contact opening portion 24a. For example, as shown in FIG. 1, the bit contact opening portion 24a is formed as a linear opening pattern 24b extending in the same direction (the Y direction shown in FIG. 1) as that of the word lines 23A. At a part where the bit contact opening pattern 24b intersects with the active area 1a, a silicon surface of the silicon substrate 1 is exposed from the bit contact opening portion 24a as shown in FIG. 16B.

When the linear opening pattern 24b for forming the bit contact opening portion 24a is formed, the resist film 122 used in the process of exposing the peripheral circuit area 2000 may be used. A resist film newly formed after removing the resist film 122 may be used. To reduce the number of processes (reduce the manufacturing cost), it is preferable to form the opening pattern 24a for forming the bit contact opening portion 24a in the resist film 122 using the alignment mark 123.

Then, as shown in FIG. 16A and FIG. 16B, using the first insulating film 24 as a mask, N type impurities such as arsenic are injected by ion injection into the surface of the silicon substrate 1 exposed from the bit contact opening portion 24a. Accordingly, an N type impurity diffusion layer is formed in the vicinity of the surface of the silicon substrate 1. The N type impurity diffusion layer becomes a diffusion area 25 serving as one of source and drain areas (in the embodiment, a drain area) of the transistor. In the diffusion area 25 of the embodiment, it is preferable that an amount of ion injection ($N^+$) is made slightly larger than an amount (N) of ion injection at the time of forming the N type impurity diffusion layer 10 to provide a concentration gradation, in order to adopt an LDD structure (Lightly Doped Drain).

(Process of Forming Bit Lines)

Figure 17A:
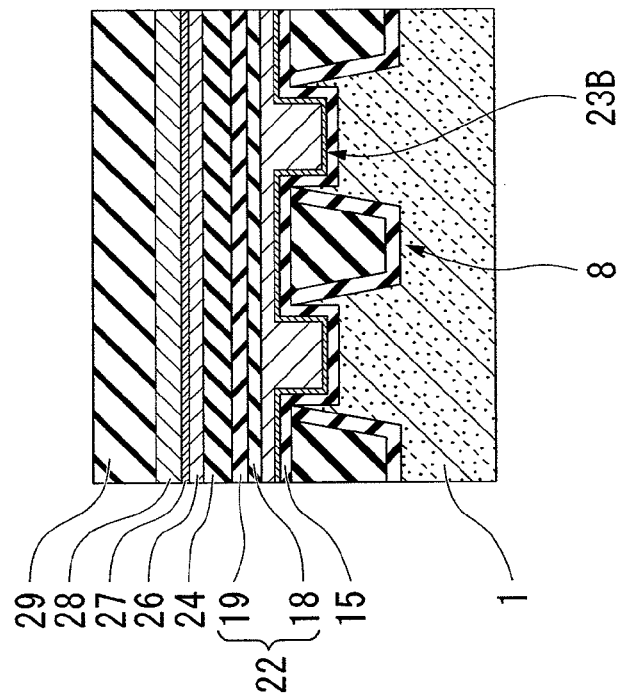
FIG. 17A is a fragmentary cross sectional elevation view, taken along an A-A' line of FIG. 1, illustrating a memory cell in a step, subsequent to the step of FIGS. 16A and 16B, involved in the method of forming the semiconductor device of FIGS. 1, 2A and 2B.
Figure 17B:
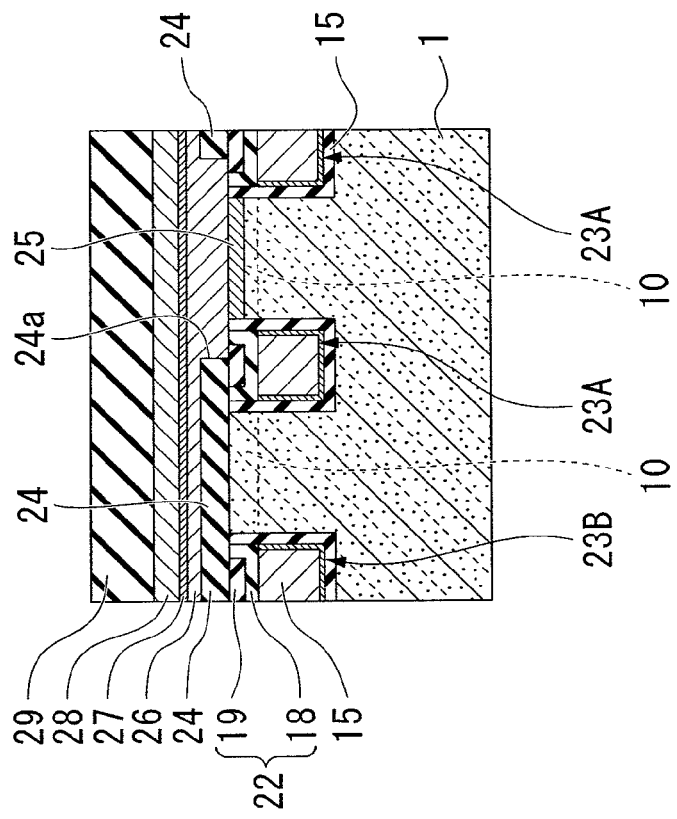
FIG. 17B is a fragmentary cross sectional elevation view, taken along a B-B' line of FIG. 1, illustrating a memory cell in a step, subsequent to the step of FIGS. 16A and 16B, involved in the method of forming the semiconductor device of FIGS. 1, 2A and 2B.

Then, bit line 30 is formed. The bit line 30 is formed as follows. First, as shown in FIG. 17A and FIG. 17B, polysilicon containing N type impurities such as phosphorous are laminated over the first interlayer insulating film 24 to form a polysilicon film 26. In this case, the polysilicon is reliably embedded in the bit contact opening portion 24a. Then, tungsten silicide (WSi), tungsten, and a silicon nitride film are sequentially laminated over the polysilicon film 26 to respectively form a tungsten silicide film 27, a tungsten film 28, and a silicon nitride film 29.

Figure 18A:
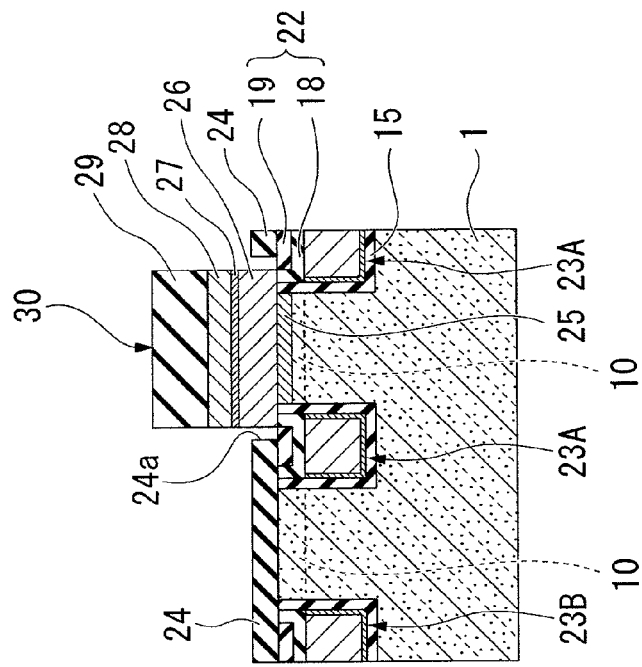
FIG. 18A is a fragmentary cross sectional elevation view, taken along an A-A' line of FIG. 1, illustrating a memory cell in a step, subsequent to the step of FIGS. 17A and 17B, involved in the method of forming the semiconductor device of FIGS. 1, 2A and 2B.
Figure 18B:
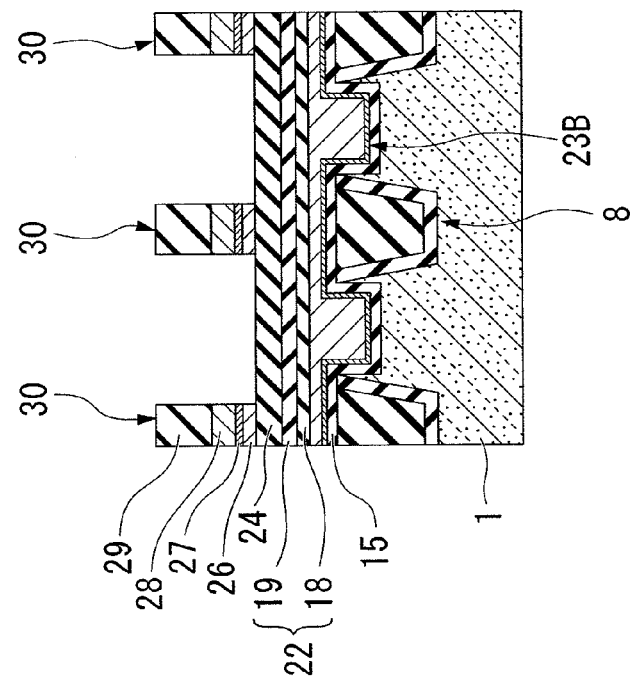
FIG. 18B is a fragmentary cross sectional elevation view, taken along a B-B' line of FIG. 1, illustrating a memory cell in a step, subsequent to the step of FIGS. 17A and 17B, involved in the method of forming the semiconductor device of FIGS. 1, 2A and 2B.

Then, as shown in FIG. 18A and FIG. 18B, a stack of the polysilicon film 26, the tungsten silicide film 27, the tungsten film 28, and the silicon nitride film 29 is linearly patterned to form the bit line 30.

The bit line 30 is connected to the diffusion area 25 which becomes a part of the source and drain areas in the bit contact opening portion 24a. That is, the polysilicon film 26 constituting the bit line 30 is connected to the diffusion area 25 formed at the surface part of the silicon substrate 1 exposed from the bit contact opening portion 24a. As described above, the bit line 30 of the embodiment also serve as contact plugs connected to the diffusion area 25 which becomes a part of the source and drain areas. In the manufacturing method of the embodiment, the bit line 30 also serving as the contact plugs is formed (integrally formed) by one lithography process.

In the embodiment, the bit contact plugs and the bit lines are formed by one lithographic printing and dry etching. Accordingly, since misalignment of the bit contact plugs and the bit lines, such as a diameter of the bit contact plugs becoming larger than a bit line width, does not occur, it is possible to suppress a problem of a short circuit with the other conductor.

The bit line 30 is formed in a pattern extending in an intersecting direction (the X direction shown in FIG. 1) of the word line 23A and the embedded line 23B. In the example shown in FIG. 1, the bit line 30 having a linear shape perpendicular to the word line 23A is shown, but it is not limited thereto. For example, the bit line 30 may be formed in a partially curved shape.

Figure 19A:
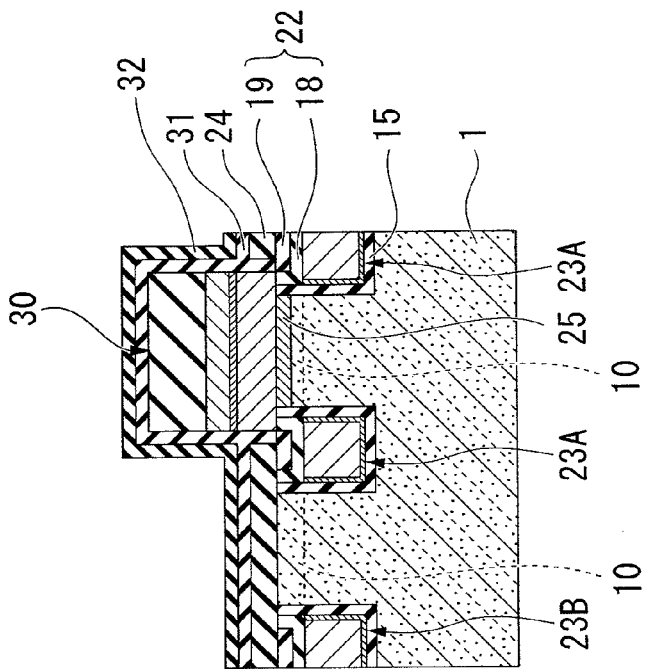
FIG. 19A is a fragmentary cross sectional elevation view, taken along an A-A' line of FIG. 1, illustrating a memory cell in a step, subsequent to the step of FIGS. 18A and 18B, involved in the method of forming the semiconductor device of FIGS. 1, 2A and 2B.
Figure 19B:
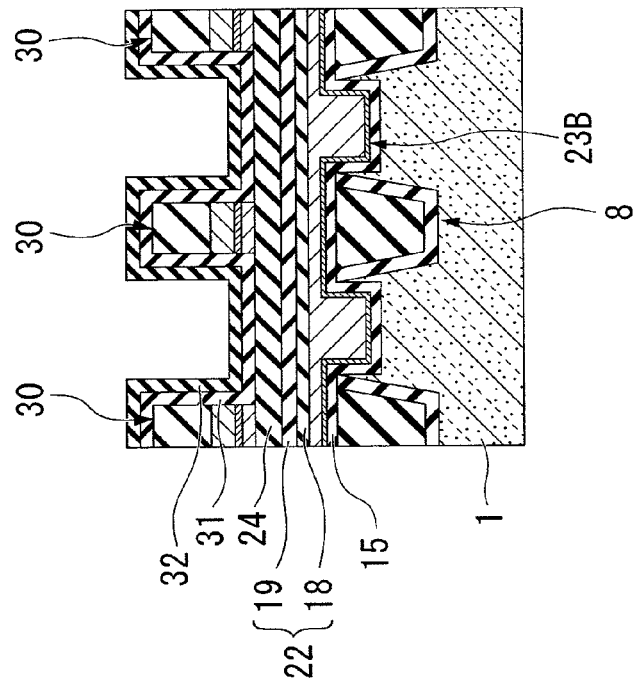
FIG. 19B is a fragmentary cross sectional elevation view, taken along a B-B' line of FIG. 1, illustrating a memory cell in a step, subsequent to the step of FIGS. 18A and 18B, involved in the method of forming the semiconductor device of FIGS. 1, 2A and 2B.

Then, as shown in FIG. 19A and FIG. 19B, the silicon nitride film 31 is formed over the first interlayer insulating film 24 to cover the surface of the bit line 30, and then a linear film 32 is laminated to cover the surface of the silicon nitride film 31. As the linear film 32, for example, a silicon nitride film ($Si_3N_4$), a silicon oxynitride (SiON), or the like may be used.

As described above, the DRAM 60 of the embodiment is provided with the peripheral circuit area (not shown) in the peripheral area of the memory cell areas shown in FIG. 1. When, for example, a planer type MOS transistor is formed in the peripheral circuit area, it is possible to simultaneously form a gate electrode of the planar type MOS transistor when the bit lines 30 formed of the laminated film are formed. A stack of the silicon nitride film 31 covering the side faces of the bit lines 30 and the linear film 32 may be used as a part of a side wall of the gate electrode in the planar type MOS transistor formed in the peripheral circuit area. Further, a stack of the silicon nitride film 31 and linear film 32 covers an inner face of the alignment mark 123. Furthermore, the stack of the silicon nitride film 31 and linear film 32 may cover the recessed portion 71 in case where the recessed portion 71 is formed.

(Process of Forming Capacitance Contact Plugs)

Next, capacitance contact plug 41 is formed. The capacitance contact plug 41 is formed as follows. First, as shown in FIG. 20A and FIG. 20B, SOD is applied onto the linear film 32 to fill a space between the bit lines 30, and an annealing process is performed in a water vapor ($H_2O$) atmosphere to reform it into a solid film, thereby forming an SOD film (insulating film) 33. Then, CMP is performed to planarize the surface of the substrate until the upper face of the linear film 32 is exposed, and then a second interlayer insulating film 34 is formed to cover the SOD film 33 and the upper face of the linear film 32. As the second interlayer insulating film 34, for example, a silicon oxide film formed by the CVD method may be used.

Figure 21A:
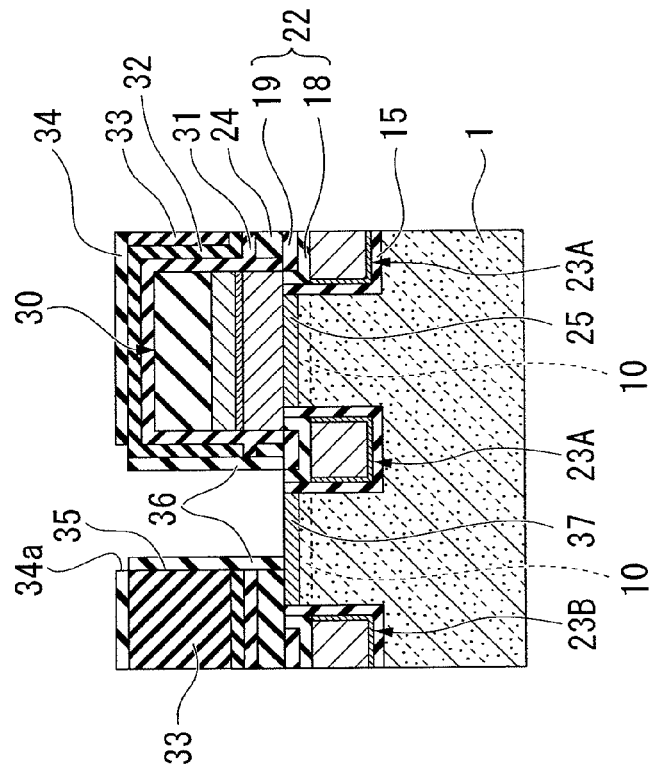
FIG. 21A is a fragmentary cross sectional elevation view, taken along an A-A' line of FIG. 1, illustrating a memory cell in a step, subsequent to the step of FIGS. 20A and 20B, involved in the method of forming the semiconductor device of FIGS. 1, 2A and 2B.
Figure 21B:
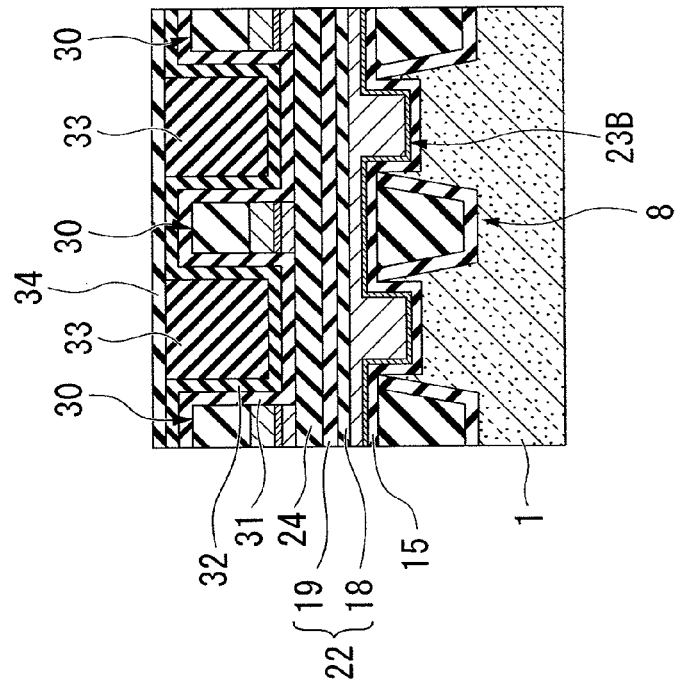
FIG. 21B is a fragmentary cross sectional elevation view, taken along a B-B' line of FIG. 1, illustrating a memory cell in a step, subsequent to the step of FIGS. 20A and 20B, involved in the method of forming the semiconductor device of FIGS. 1, 2A and 2B.

Then, as shown in FIG. 21A and FIG. 21B, a capacitance contact opening portion 35 is formed using a photolithography technique and a dry etching technique. The capacitance contact opening portion 35 is formed by an SAC (Self Alignment Contact) method using, as side walls, the silicon nitride film 31 and the linear film 32 formed as the side walls of the bit lines 30.

Figure 28:
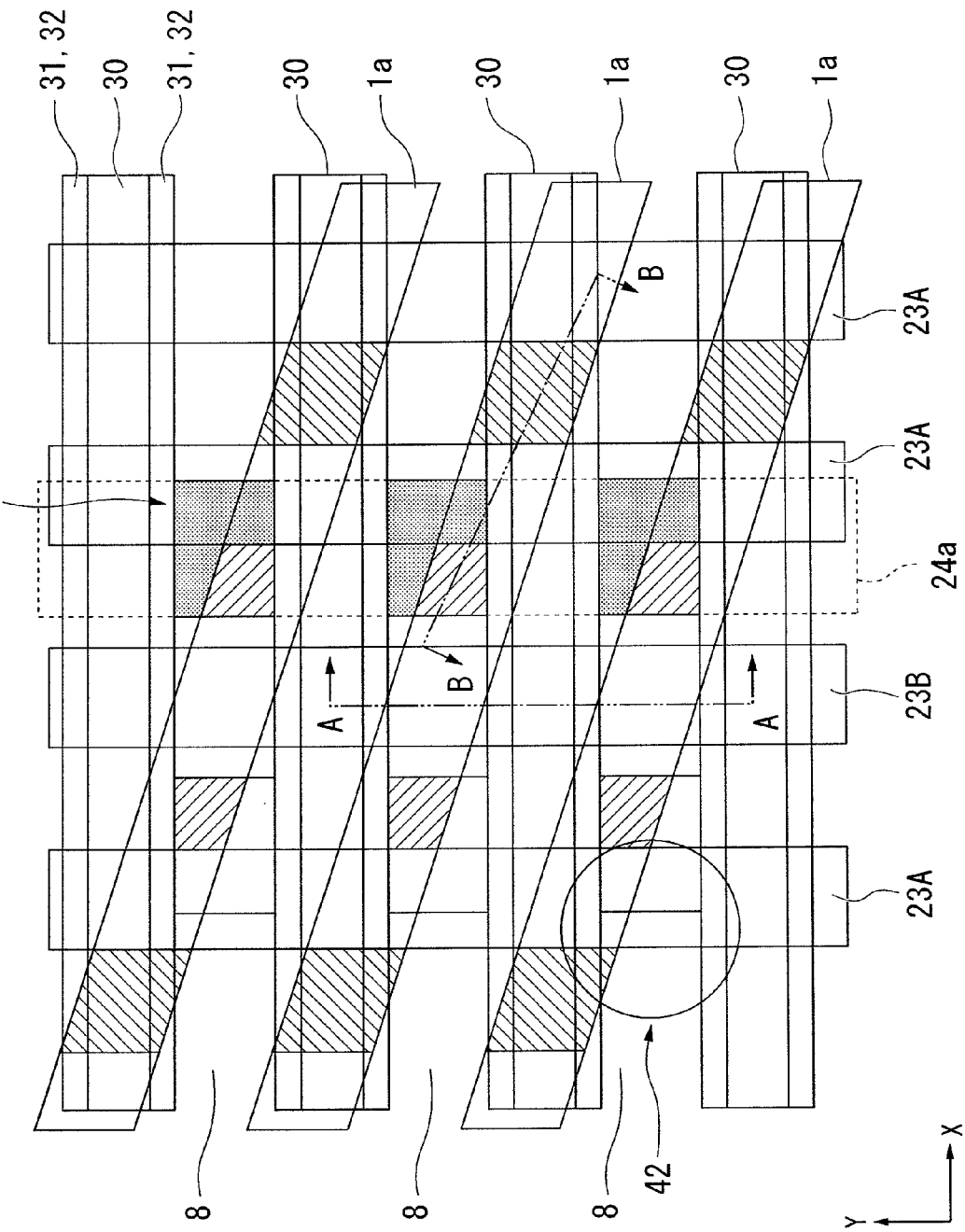
FIG. 28 is a fragmentary plan view illustrating one embodiment of the present invention, involved in the method of forming the semiconductor device of FIGS. 1, 2A and 2B.

Specifically, as shown in FIG. 28, first, a linear opening pattern 34a extending, for example, in the same direction (the Y direction shown in FIG. 28) as that of the word line 23A is formed in the second interlayer insulating film 34. In the case of forming the opening pattern 34a, an opening is self-aligned in the SOD film 33 by dry-etching in a width direction of which is regulated in the silicon nitride film 31 and the linear film 32 formed on the side face of the bit lines 30 when the SOD film 33 is dry-etched with the second insulating film 34. Then, the linear film 32, the silicon nitride film 31, and the first interlayer insulating film 24 which are exposed from the opening are sequentially removed by etching, to form the capacitance contact opening portion 35.

As shown in FIG. 28, at the part where the capacitance contact opening portion 35 overlaps with the active area 1a, the silicon surface of the silicon substrate 1 is exposed from the capacitance contact opening portion 35 as shown in FIG. 21B.

Then, as shown in FIG. 21A and FIG. 21B, side walls (SW) 36 formed of, for example, silicon nitride film are formed over the inner wall portions of the capacitance contact opening portion 35. Then, N type impurities such as phosphorous are injected by ion injection to the surface of the silicon substrate 1 exposed from the capacitance contact opening portion 35, using the second interlayer insulating film 34 as a mask. Accordingly, an N type impurity diffusion layer is formed in the vicinity of the silicon surface of the silicon substrate 1. The N type impurity diffusion layer becomes a diffusion area 37 serving as the other of the source and drain areas (source area in the embodiment) of the transistor.

Figure 22A:
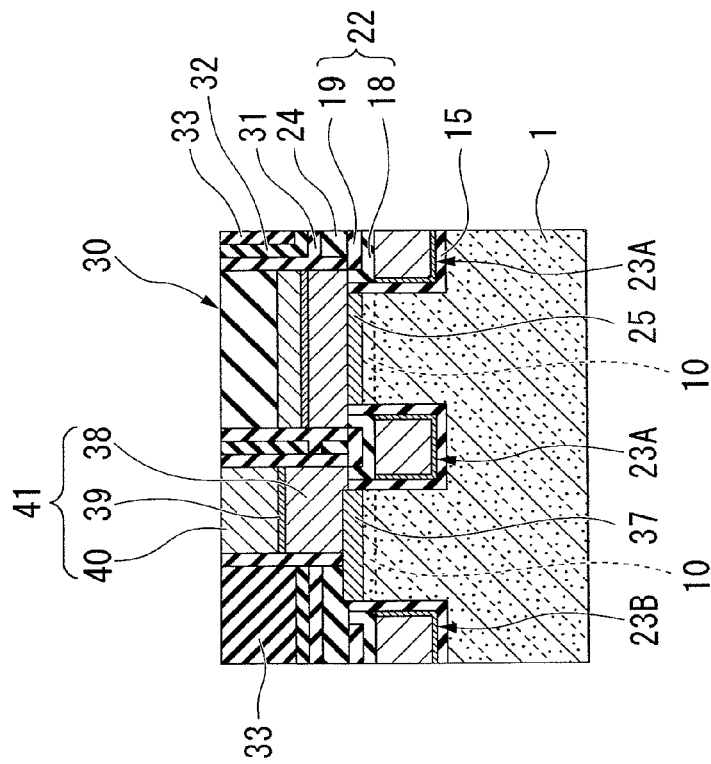
FIG. 22A is a fragmentary cross sectional elevation view, taken along an A-A' line of FIG. 1, illustrating a memory cell in a step, subsequent to the step of FIGS. 21A and 21B, involved in the method of forming the semiconductor device of FIGS. 1, 2A and 2B.
Figure 22B:
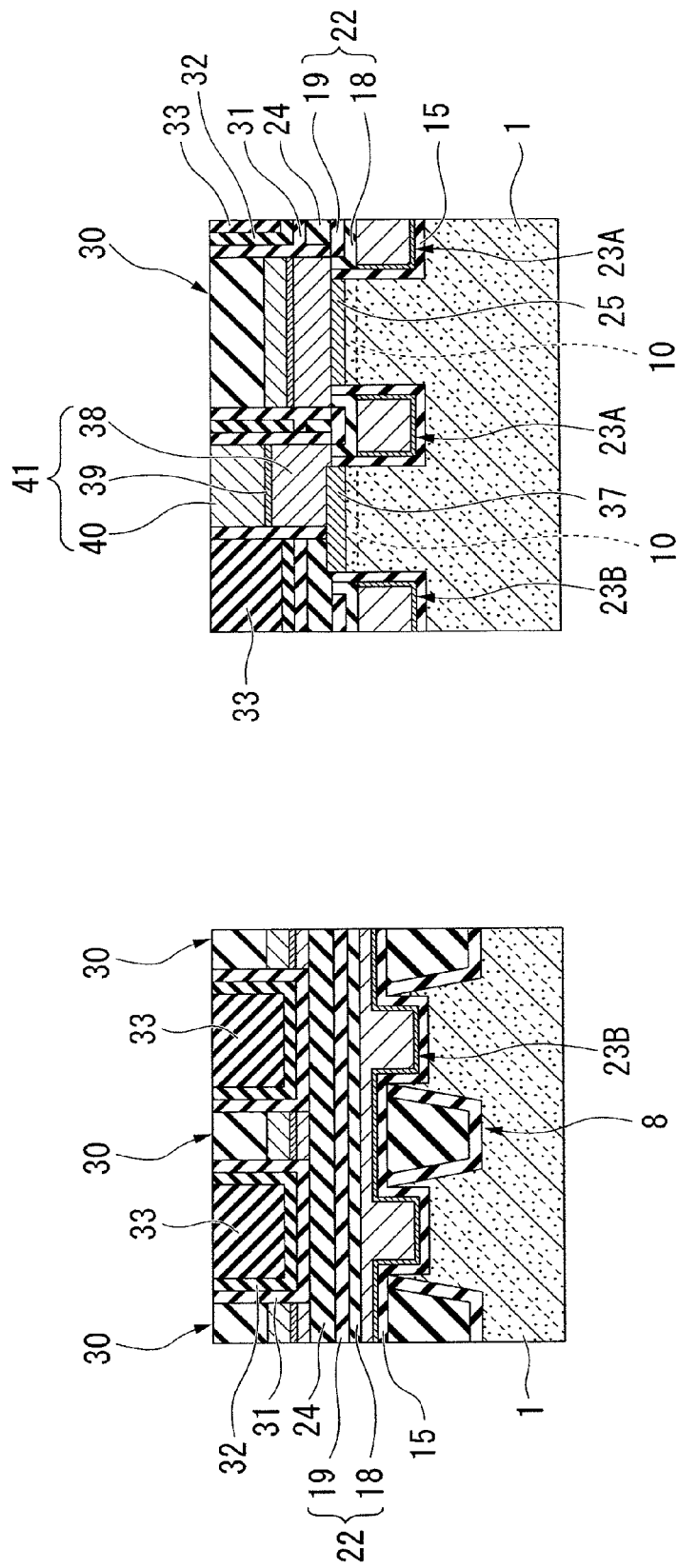
FIG. 22B is a fragmentary cross sectional elevation view, taken along a B-B' line of FIG. 1, illustrating a memory cell in a step, subsequent to the step of FIGS. 21A and 21B, involved in the method of forming the semiconductor device of FIGS. 1, 2A and 2B.

Then, as shown in FIG. 22A and FIG. 22B, polysilicon containing phosphorous is laminated over the second interlayer insulating film 34 to fill the inside of the capacitance contact opening portion 35, and etch-back is performed to form a polysilicon layer 38 at the bottom of the capacitance contact opening portion 35. Then, a cobalt silicide (CoSi) layer 39 is formed on the surface of the polysilicon layer 38, and tungsten is laminated to fill the inside of the capacitance contact opening portion 35, thereby forming a tungsten film. Then, the surface is planarized by CMP until the surface of the SOD film 33 is exposed, tungsten is allowed to remain in the capacitance contact opening portion 35 to form a tungsten layer 40. In such a manner, the capacitance contact plugs 41 formed of the polysilicon layer 38, the cobalt silicide layer 39, and the tungsten layer 40 are formed.

(Process of Forming Capacitor)

Figure 23A:
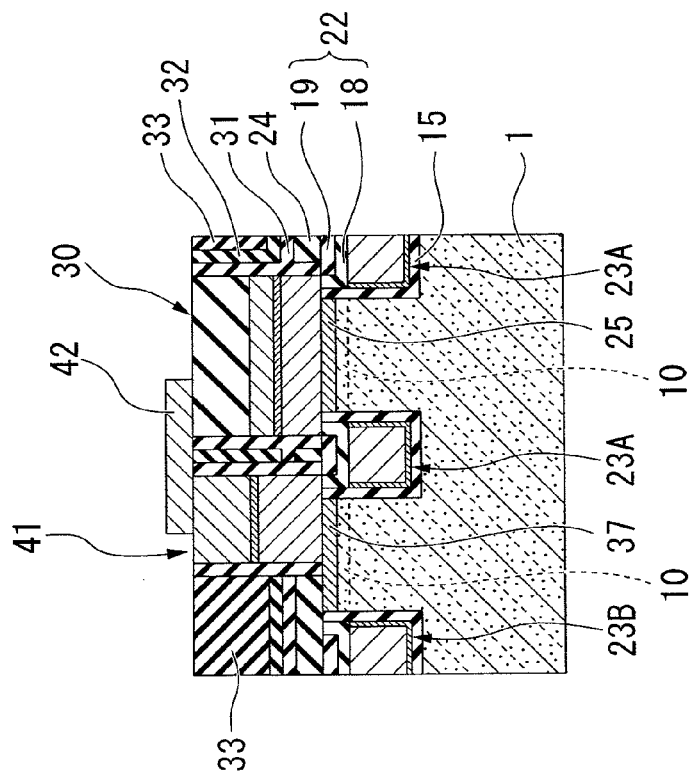
FIG. 23A is a fragmentary cross sectional elevation view, taken along an A-A' line of FIG. 1, illustrating a memory cell in a step, subsequent to the step of FIGS. 22A and 22B, involved in the method of forming the semiconductor device of FIGS. 1, 2A and 2B.
Figure 23B:
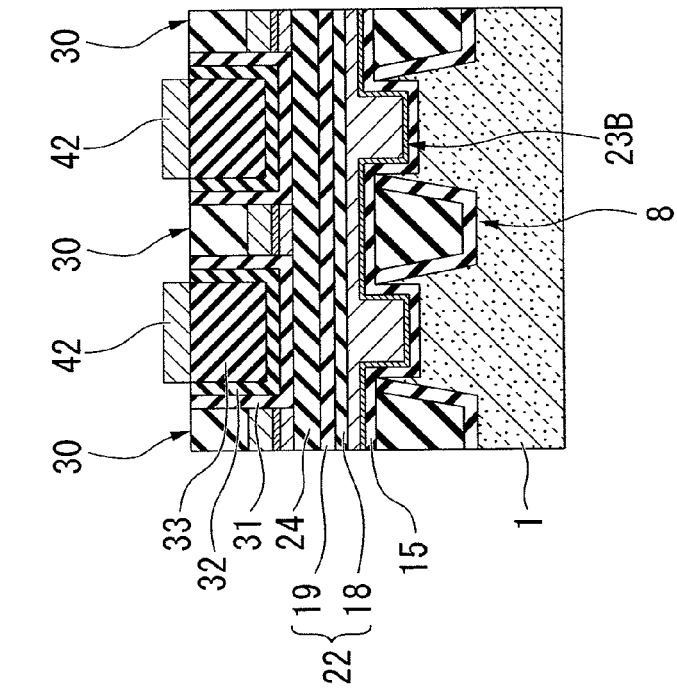
FIG. 23B is a fragmentary cross sectional elevation view, taken along a B-B' line of FIG. 1, illustrating a memory cell in a step, subsequent to the step of FIGS. 22A and 22B, involved in the method of forming the semiconductor device of FIGS. 1, 2A and 2B.

Then, capacitors are formed. The capacitors are formed as follows. First, tungsten nitride (WN) and tungsten (W) are sequentially laminated on the surface of the substrate after forming the capacitance contact plugs 41, to form a laminated film. Then, the laminated film is patterned to form a capacitance contact pad 42 as shown in FIG. 23A and FIG. 23B. As shown in FIG. 1, it is necessary to form the capacitance contact pads 42 in the memory cell areas at equal intervals. For this reason, as shown in FIG. 23B, although the capacitance contact pad 42 is formed at a position deviating from the upside of the capacitance contact plug 41, the capacitance contact plug 41 is connected to the capacitance contact pad 42 at a part where the bottom of the capacitance contact pad 42 is overlapped with the upper face of the capacitance contact pad 41.

Figure 24A:
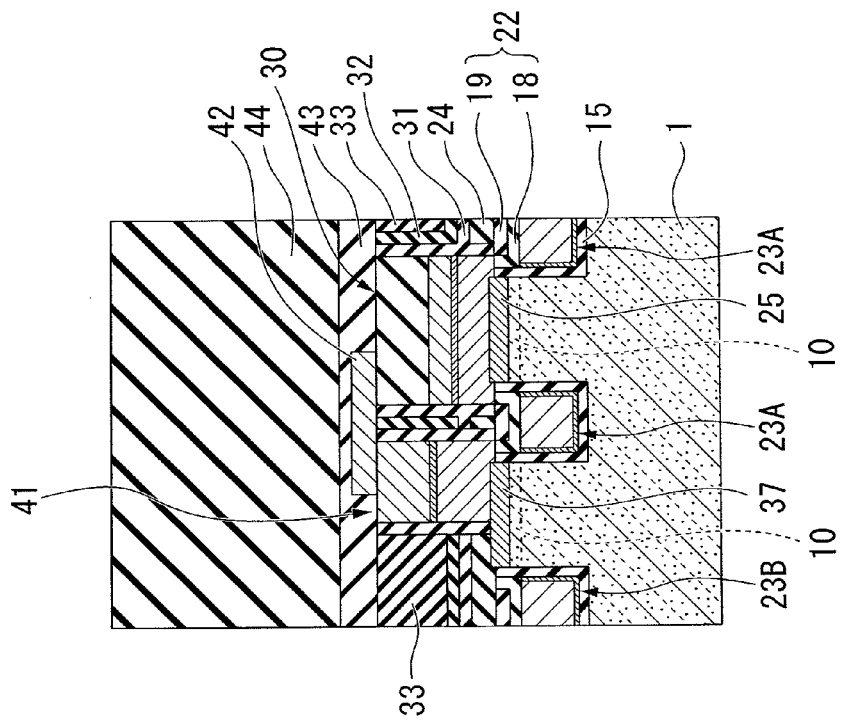
FIG. 24A is a fragmentary cross sectional elevation view, taken along an A-A' line of FIG. 1, illustrating a memory cell in a step, subsequent to the step of FIGS. 23A and 23B, involved in the method of forming the semiconductor device of FIGS. 1, 2A and 2B.
Figure 24B:
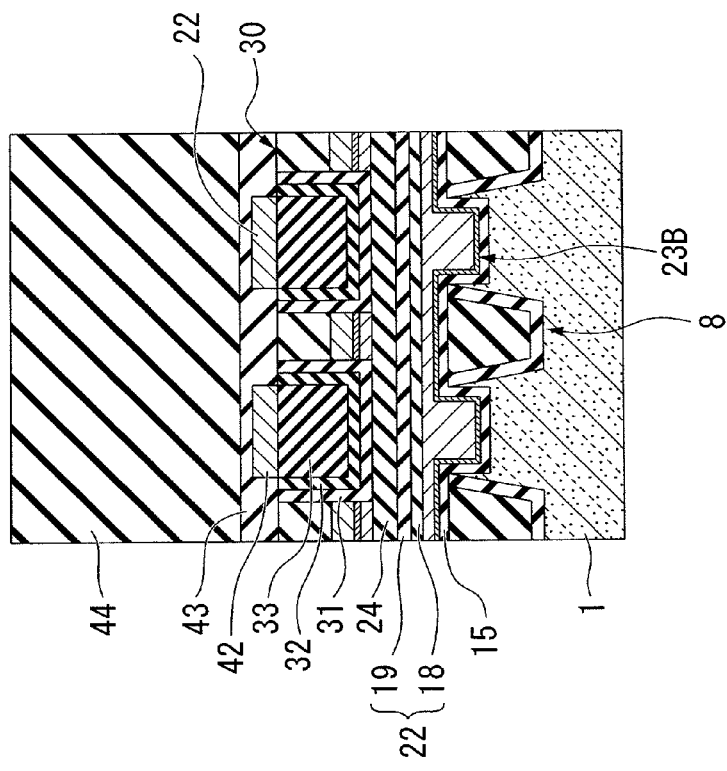
FIG. 24B is a fragmentary cross sectional elevation view, taken along a B-B' line of FIG. 1, illustrating a memory cell in a step, subsequent to the step of FIGS. 23A and 23B, involved in the method of forming the semiconductor device of FIGS. 1, 2A and 2B.

Then, as shown in FIG. 24A and FIG. 24B, a stopper film 43 is formed over the substrate using, for example, a silicon nitride film or the like, to cover the capacitance contact pads 42. Then, a third interlayer insulating film 44 is formed over the stopper film 43, using, for example, a silicon oxide film or the like.

Figure 25A:
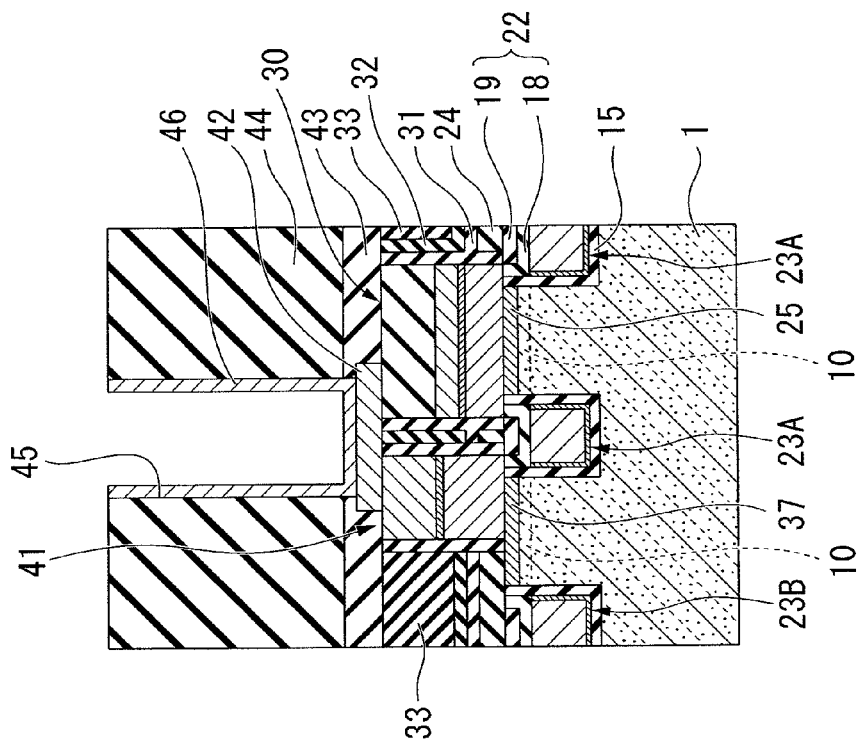
FIG. 25A is a fragmentary cross sectional elevation view, taken along an A-A' line of FIG. 1, illustrating a memory cell in a step, subsequent to the step of FIGS. 24A and 24B, involved in the method of forming the semiconductor device of FIGS. 1, 2A and 2B.
Figure 25B:
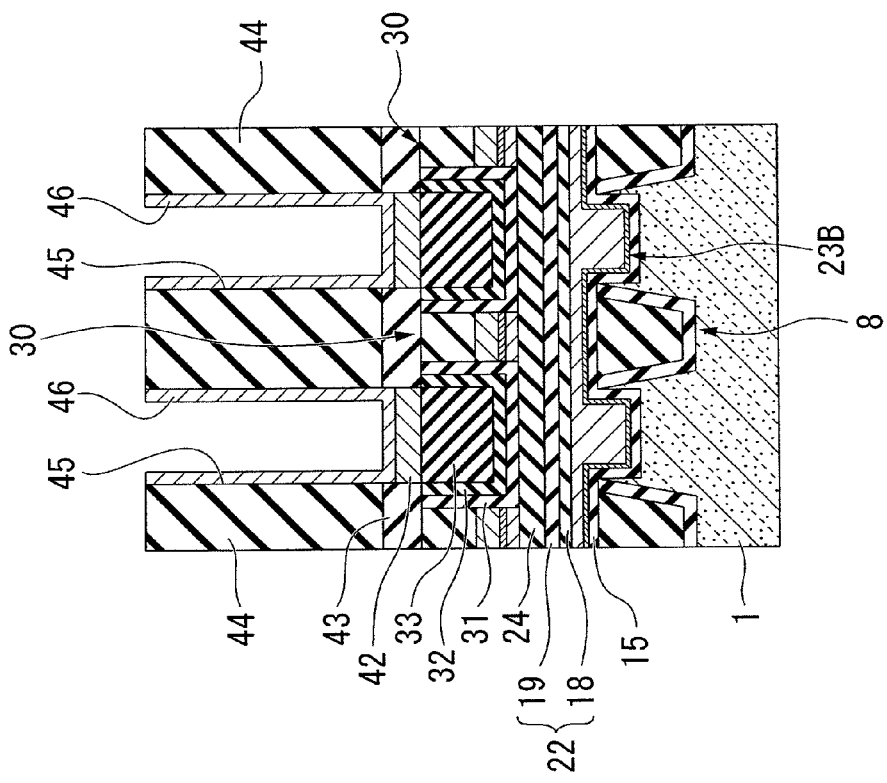
FIG. 25B is a fragmentary cross sectional elevation view, taken along a B-B' line of FIG. 1, illustrating a memory cell in a step, subsequent to the step of FIGS. 24A and 24B, involved in the method of forming the semiconductor device of FIGS. 1, 2A and 2B.

Then, as shown in FIG. 25A and FIG. 25B, contact holes 45 passing through the third interlayer insulating film 44 and the stopper film 43 formed over the capacitance contact pads 42 are formed to expose a part of the upper faces of the capacitance contact pads 42. Then, a lower electrode 46 of the capacitor element is formed using, for example, titanium nitride or the like, to cover the inner wall face of the contact hole 45 and the upper face of the capacitance contact pad 42. Accordingly, the bottom of the lower electrode 46 is connected to the upper face of the capacitance contact pad 42.

Figure 26A:
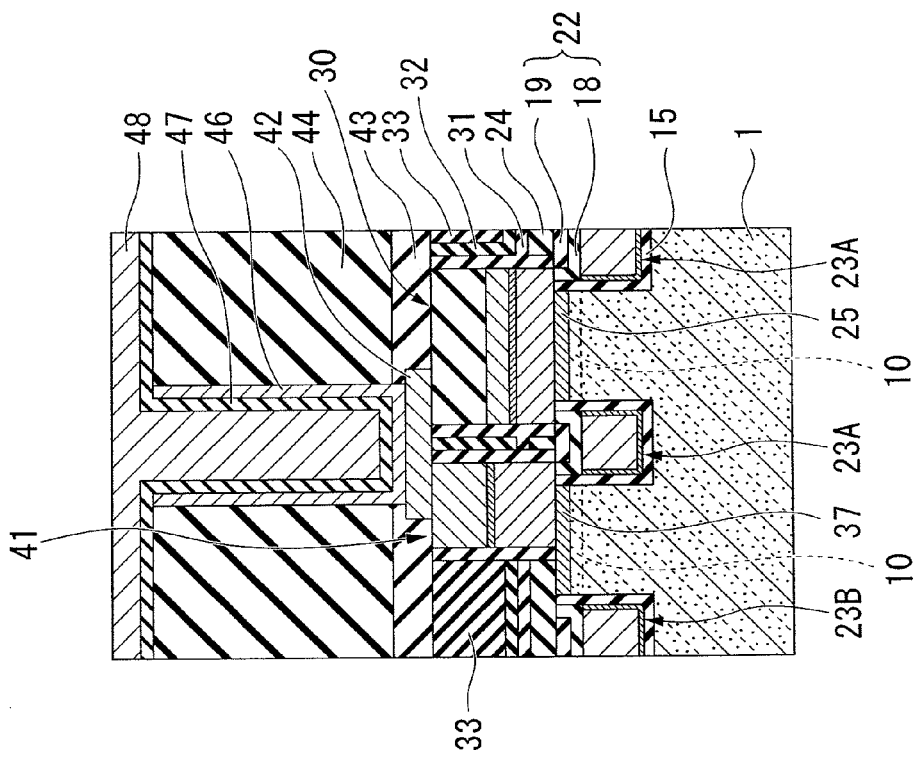
FIG. 26A is a fragmentary cross sectional elevation view, taken along an A-A' line of FIG. 1, illustrating a memory cell in a step, subsequent to the step of FIGS. 25A and 25B, involved in the method of forming the semiconductor device of FIGS. 1, 2A and 2B.
Figure 26B:
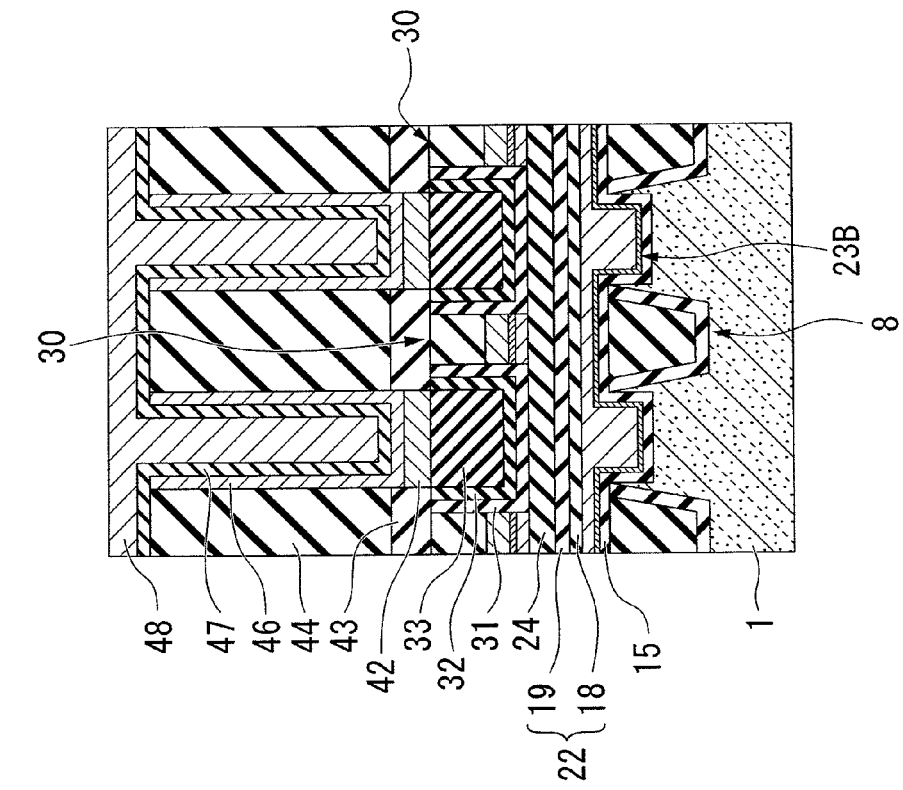
FIG. 26B is a fragmentary cross sectional elevation view, taken along a B-B' line of FIG. 1, illustrating a memory cell in a step, subsequent to the step of FIGS. 25A and 25B, involved in the method of forming the semiconductor device of FIGS. 1, 2A and 2B.

Then, as shown in FIG. 26A and FIG. 26B, a capacitance insulating film 47 is formed over the third interlayer insulating film 44 to cover the surfaces of the lower electrodes 46. As the capacitance insulating film 47, for example, zirconium oxide ($ZrO_2$), aluminum oxide ($Al_2O_3$), hafnium oxide ($HfO_2$), and a laminated film thereof may be used. Then, an upper electrode 48 of the capacitor elements is formed using, for example, titanium nitride or the like, to cover the surface of the capacitance insulating film 47. In such a manner, the capacitors are formed.

(Process of Forming Wiring Layer)

Figure 27B:
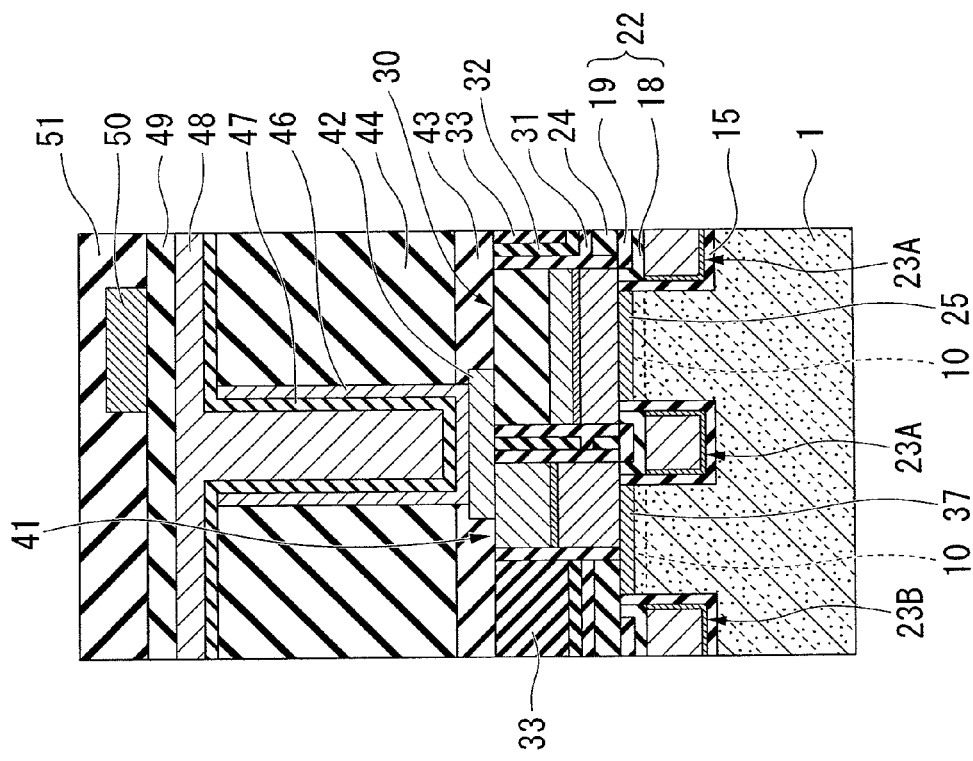
FIG. 27B is a fragmentary cross sectional elevation view, taken along a B-B' line of FIG. 1, illustrating a memory cell in a step, subsequent to the step of FIGS. 26A and 26B, involved in the method of forming the semiconductor device of FIGS. 1, 2A and 2B.
Figure 27A:
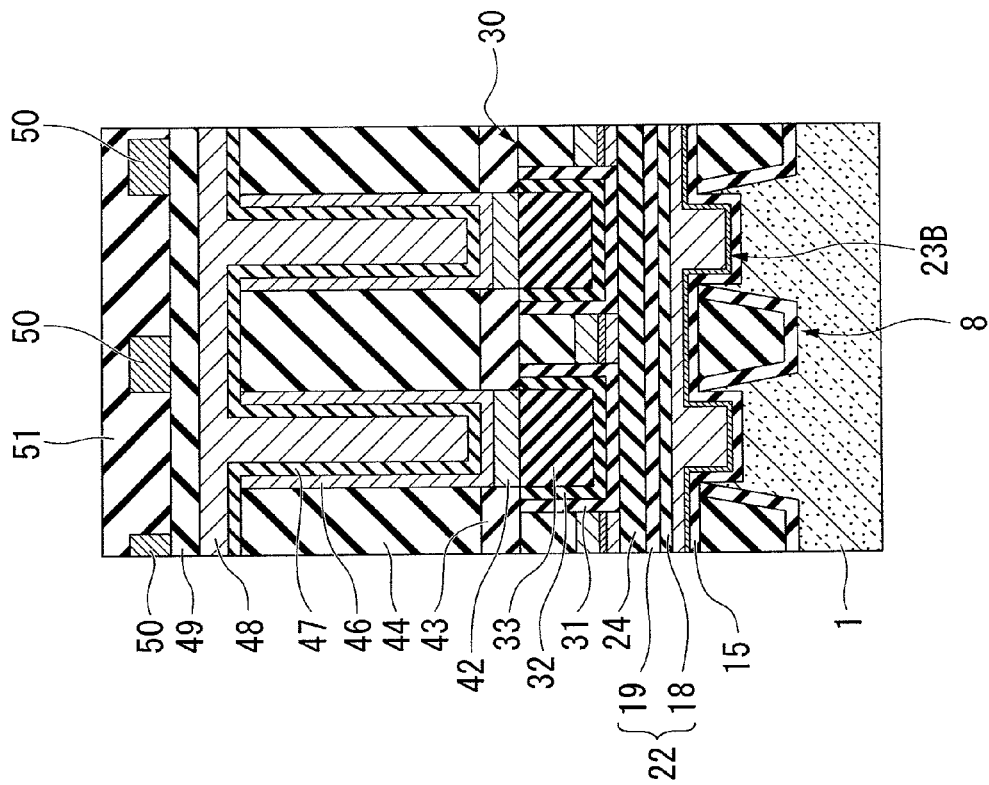
FIG. 27A is a fragmentary cross sectional elevation view, taken along an A-A' line of FIG. 1, illustrating a memory cell in a step, subsequent to the step of FIGS. 26A and 26B, involved in the method of forming the semiconductor device of FIGS. 1, 2A and 2B.

Then, a wiring layer is formed over the silicon substrate 1 with the capacitor element interposed therebetween. The wiring layer is formed as follows. First, as shown in FIG. 27A and FIG. 27B, a fourth interlayer insulating film 49 formed of, for example, a silicon oxide film or the like, is formed to cover the upper electrode 48. Then, upper metal lines 50 are formed of, for example, aluminum (Al), copper (Cu), or the like over the fourth interlayer insulating film 49. Thereafter, a protective film 51 is formed to cover the upper metal lines 50, and thus the manufacturing of memory cells of the DRAM is completed.

As described above, the DRAM 60 of the embodiment is manufactured.

As described above, the DRAM (semiconductor device) 60 of the embodiment, is formed as follows. The first interlayer insulating film (interlayer insulating film) 1 is formed over the silicon (semiconductor) substrate 1. The surface of the polysilicon film 121 provided on the upper face of the silicon substrate 1 of the peripheral circuit area 2000 and a part of the surface of the substrate are exposed while the alignment mark 123 is exposed and formed in the alignment mark area 3000. The bit contact opening portions 24a is formed in the first interlayer insulating film. Accordingly, it is not necessary to separately provide the photolithography process for exposing the peripheral circuit area 2000 and the photolithography process for exposing the alignment mark area 3000 to form the alignment mark 123. It is possible to reduce the photolithography processes to only forming the alignment mark 123. Therefore, it is possible to reduce the manufacturing cost by reducing the number of processes.

According to the method of manufacturing the DRAM 60 of the embodiment, the first interlayer insulating film 24 is formed over the silicon substrate. The resist film 122 is formed to cover the first interlayer insulating film 24 in the peripheral circuit area 2000 and the alignment mark area 3000 and to expose the first interlayer insulating film 24 in the memory cell area 1000. The first interlayer insulating film exposed from the resist film 122 is removed to expose the polysilicon film 121 provided on the surface of the substrate in the peripheral circuit area 2000. The level difference between upper face of the silicon substrate 1 and the upper face of the STI element isolation film 8 by partially etching the exposed STI element isolation film 8 in the alignment mark area 3000. Accordingly, it is possible to form the alignment mark 123 while protecting the first interlayer insulating film 24 of the memory cell area 1000, using the photolithography process of exposing the peripheral circuit area 2000.

In the manufacturing method of the embodiment, since the height d of the level difference provided between the upper face of the silicon substrate 1 and the upper face of the STI element isolation film 8 is at least 100 nm or more, it is possible to form an alignment mark 123 which can be clearly recognized in the lithography process.

In the manufacturing method of the embodiment, the upside of the polysilicon film 121 provided over the substrate of the peripheral circuit area 2000 is coated with the resist film 122 by a predetermined width from the part adjacent to the memory cell area 1000. It is possible to prevent the etching liquid from excessively infiltrating into the first interlayer insulating film 24 coating the memory cell area 1000 when removing the first interlayer insulating film 24 of the peripheral circuit area 2000 and the alignment mark area 3000. The width r of the part coating the peripheral circuit area 2000 by the resist film 122 may be appropriately selected depending on the height d of the level difference.

When the linear opening pattern 24b for forming the bit contact opening portion 24a is formed using the alignment mark 123, it is possible to further reduce the number of processes (reduce the manufacturing cost).

According to the method of manufacturing the DRAM 60 of the embodiment, the bit contact plug and the bit line 30 are formed by one lithographic printing and dry etching, misalignment of the bit contact plug and the bit line, such as the diameter of the bit contact plug being larger than the bit line width, does not occur. For this reason, it is possible to suppress a problem of a short circuit with the other conductor.

The technical field of the invention is not limited to the embodiment, and may be variously modified within the scope which does not deviate from the concept of the invention. For example, in the DRAM of the embodiment, in the configuration of the memory cells, an example of using the recess channel transistors as the embedded gate transistors in which the word lines are completely embedded in the semiconductor substrate was shown, but the invention is not limited thereto, and various types of transistors may be applied.

Specifically, a configuration of the memory cells may be exemplified as shown in FIG. 29A and FIG. 29B. In the same manner, the memory cells of the example are a laminated film structure which includes transistors with embedded gates being completely embedded in the semiconductor substrate, capacitors, and wiring layers. Configurations other than the configuration of the embedded gate transistor are the same as the embodiment. Accordingly, in the following description, the same reference numerals and signs are given to the same constituent elements as the semiconductor device of the embodiment, and the description thereof is not repeated.

As shown in FIG. 29A and FIG. 29B, in the embedded gate transistors of this example, a part of the bottom face of the embedded line 223B is embedded in the upper face of the STI element isolation films 208 provided in the lengthwise direction of the embedded line 223B as shown in FIG. 29A. That is, the upper face of the STI element isolation film 208 is lower than the surface of the silicon substrate 1 between the adjacent STI element isolation films 208. Accordingly, adjacent saddle-shaped silicon portions 214, with the part embedded in the STI element isolation film 208 and the gate insulating film 15 interposed therebetween, of the bottom of the embedded line 223B are provided on the upper face of the silicon substrate 1.

Herein, the embedded gate electrode 223A have the same structure as the embedded line 223B, and thus the same saddle-shaped silicon portion 214 is provided even in the embedded gate electrode 223A. The saddle-shaped silicon portion 214 can serve as channel when a potential difference between the source area and the drain area exceeds a threshold value. As described above, the embedded gate transistor of the example constitute saddle fin type transistor having the same channel areas as the saddle-shaped silicon portion 214.

Subsequently, a method of manufacturing the saddle fin type transistors having the above-described configuration will be described.

The process of forming the element isolation areas (see FIG. 3A to FIG. 6B) and formation of a hard mask in the process of forming the embedded gate electrodes (see FIG. 7) are the same as the embodiment.

Figure 30B:
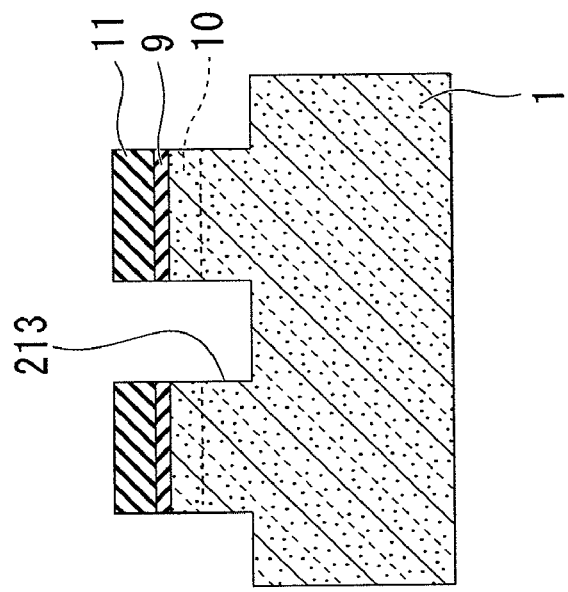
FIG. 30B is a fragmentary cross sectional elevation view, taken along a B-B' line of FIG. 1, illustrating a memory cell in a step, illustrating another embodiment of the present invention.
Figure 30A:
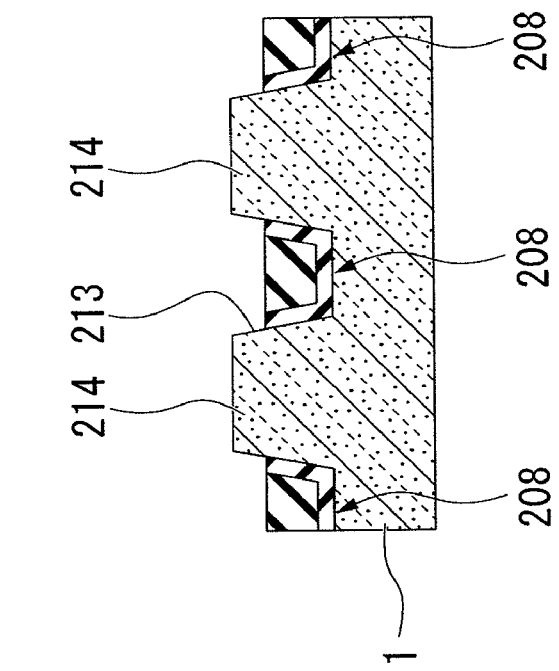
FIG. 30A is a fragmentary cross sectional elevation view, taken along an A-A' line of FIG. 1, illustrating a memory cell in a step, illustrating another embodiment of the present invention.

Then, as shown in FIG. 30A and FIG. 30B, the silicon substrate 1 exposed from the hard mask is etched by dry etching, thereby forming the gate electrode groove (trenches) 213. As shown in FIG. 30A, when the gate electrode groove 213 is formed, the STI element isolation films 208 is etched deeper than the silicon layer of the silicon substrate 1. Accordingly, the saddle-shaped silicon portion 214 remains at the part being into contact with the gate electrode grooves 213 at a part of the silicon layer higher than the upper face of the STI element isolation film 208. The saddle-shaped silicon portion 214 serves as the channel area of the transistor.

Then, as shown in FIG. 9A and FIG. 9B, the gate insulating film 15 is formed over the inner wall face of the gate electrode groove 213 and the whole surface of the substrate, and then gate electrode materials are sequentially laminated over the gate insulating film 15 to fill the inside of the gate electrode groove 213.

Figure 31B:
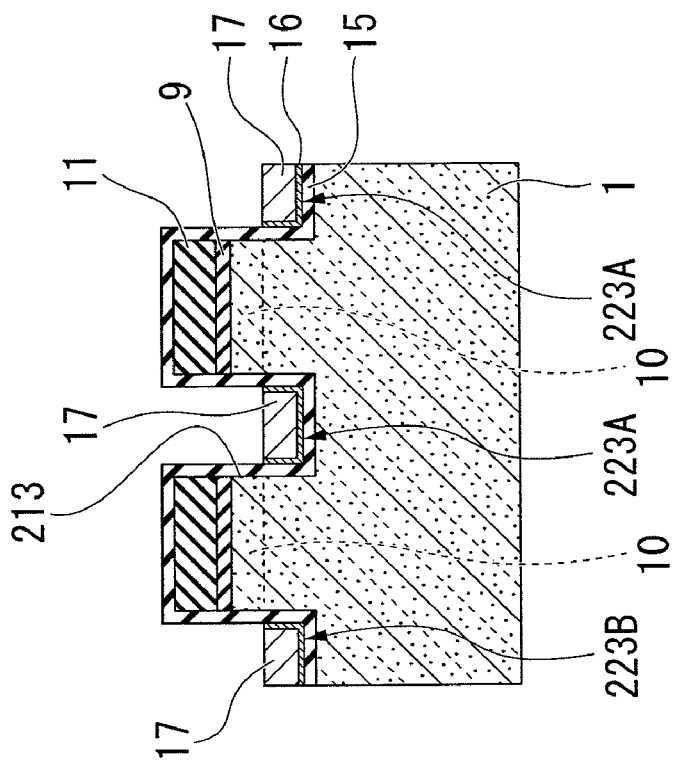
FIG. 31B is a fragmentary cross sectional elevation view, taken along a B-B' line of FIG. 1, illustrating a memory cell in a step, illustrating another embodiment of the present invention.
Figure 31A:
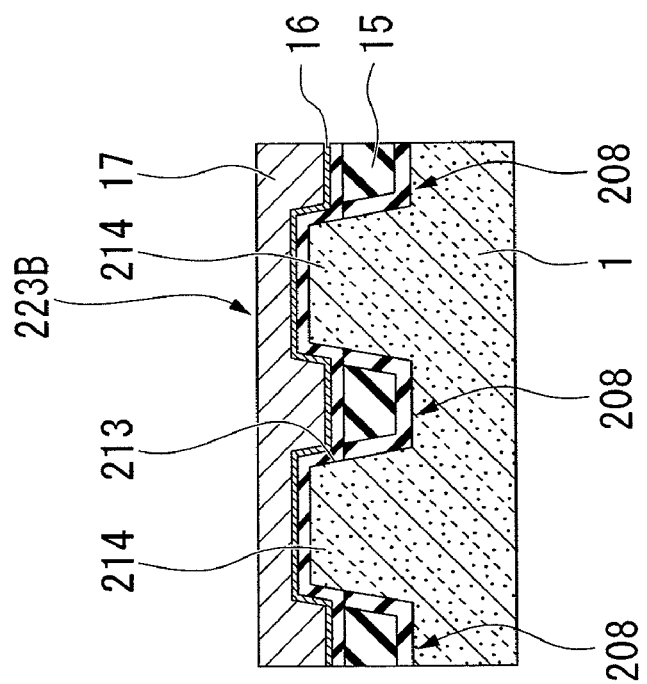
FIG. 31A is a fragmentary cross sectional elevation view, taken along an A-A' line of FIG. 1, illustrating a memory cell in a step, illustrating another embodiment of the present invention.

Then, as shown in FIG. 31A and FIG. 31B, the titanium nitride film 16 and the tungsten film 17 embedded in the gate electrode groove 213 are etched back such that the titanium nitride film 16 and the tungsten film 17 are allowed to remain only at the bottom of the gate electrodes groove 213. In such a manner, the embedded gate electrode (word line) 223A and the embedded line 223B embedded in the gate electrodes groove 213 provided in the silicon substrate 1 are formed.

The later processes are the same as the above-described embodiment.

As described in the example, there is an advantage of increasing on-current by applying the saddle fin type transistor as the embedded gate transistor.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
    forming a first groove in a semiconductor substrate;
    forming an insulating film in the first groove;
    forming an interlayer insulating film covering the first groove; and
    performing a removing process that removes a part of the interlayer insulating film and a part of the insulating film in the first groove to form an alignment mark in the first groove,
    wherein the forming the insulating film comprises:
    forming a first silicon oxide film on an inside wall of the first groove;
    forming a silicon nitride film partially filling the first groove;

forming a second silicon oxide film over the silicon nitride, the second silicon oxide film being in the first groove, and wherein the removing process comprises:

removing a part of the interlayer insulating film in a horizontal direction while removing a part of the first silicon oxide film, a part of the silicon nitride film, and a part of the second silicon oxide film in a vertical direction.

2. The method according to claim 1, wherein the removing process is performed to form a level difference between an upper face of the semiconductor substrate and an upper face of the insulating film in the first groove.

3. The method according to claim 2, wherein the level difference is at least 100 nm.

4. The method according to claim 1, further comprising: forming a resist film over the interlayer insulating film.

5. The method according to claim 4, further comprising: forming a semiconductor film over the semiconductor substrate before forming the interlayer insulating film, the semiconductor film and the resist film partially overlapping each other by an overlapping width.

6. The method according to claim 1, further comprising: forming a gate electrode groove in the semiconductor substrate; and
forming a gate electrode in the gate electrode groove.

7. The method according to claim 1, wherein the removing process forms the alignment mark and a bit contact opening portion in the interlayer insulating film.

8. The method according to claim 1, further comprising: forming a second groove in a memory cell area of the semiconductor substrate; and
forming a resist film over the interlayer insulating film that overlaps the second groove after forming the interlayer insulating film, wherein forming the first silicon oxide film comprises:
forming the first silicon oxide film on an inside face of the first groove and on an inside face of the second groove;
forming the silicon nitride film in the first groove and the second groove; and
forming the second silicon oxide film over the silicon nitride film;

wherein the removing process further comprises:
removing the second silicon oxide film in the first groove while removing a part of the second silicon oxide film in the second groove to form a recessed portion in the second silicon oxide film in the second groove.

9. The method according to claim 1 further comprising: forming a second groove in a memory cell area of the semiconductor substrate; and
forming a resist film over the interlayer insulating film that overlaps the second groove after forming the interlayer insulating film, wherein forming the first silicon oxide film comprises:
forming the first silicon oxide film on an inside face of the first groove and on an inside face of the second groove;
forming the silicon nitride film in the first groove and the second groove; and
forming the second silicon oxide film over the silicon nitride film, wherein the removing process comprises:
removing the interlayer insulating film in the first groove and in the second groove to expose a surface of the second silicon oxide film in the second groove.

10. A method of forming a semiconductor device, the method comprising:
forming a first groove and a second groove in a semiconductor substrate;
forming an insulating film in the first groove and the second groove;
forming a semiconductor film over at least the insulation film in the first groove;
forming an interlayer insulating film over the semiconductor film and the insulating film in the first groove and the second groove;
forming a resist film that covers the semiconductor film over the first groove;
performing an etching process that etches the interlayer insulating film and the insulating film;

wherein the etching process comprises:
removing the interlayer insulating film over the first groove to form a gap between the resist film and the semiconductor film; and
removing the interlayer insulating film and the insulating film over the second groove to form a third groove in the second groove, wherein removing the interlayer insulating film over the first groove is performed while removing the interlayer insulating film and the insulating film over the second groove is performed.

11. The method according to claim 10, wherein the forming the insulating film comprises:
forming a silicon oxide film on the semiconductor substrate; and
forming a silicon nitride film over the silicon oxide film.

12. The method according to claim 10, wherein the etching process is performed to form a level difference between an upper face of the semiconductor substrate and an upper face of the insulating film in the second groove.

13. The method according to claim 12, wherein the level difference is at least 100 nm.

14. The method according to claim 10, wherein the semiconductor film and the resist film partially overlap each other by an overlapping width that depends on the level difference.

* * * * *